United States Patent
Vinciarelli

(10) Patent No.: US 10,903,734 B1
(45) Date of Patent: Jan. 26, 2021

(54) DELIVERING POWER TO SEMICONDUCTOR LOADS

(71) Applicant: Vicor Corporation, Andover, MA (US)

(72) Inventor: Patrizio Vinciarelli, Boston, MA (US)

(73) Assignee: Vicor Corporation, Andover, MA (US)

( * ) Notice: Subject to any disclaimer, the term of this patent is extended or adjusted under 35 U.S.C. 154(b) by 58 days.

(21) Appl. No.: 16/218,418

(22) Filed: Dec. 12, 2018

Related U.S. Application Data

(63) Continuation-in-part of application No. 15/616,288, filed on Jun. 7, 2017, now Pat. No. 10,277,105, which
(Continued)

(51) Int. Cl.
| | |
|---|---|
| *H02M 1/08* | (2006.01) |
| *H05K 1/14* | (2006.01) |
| *H01L 23/00* | (2006.01) |
| *H05K 1/02* | (2006.01) |
| *H02M 1/00* | (2006.01) |

(52) U.S. Cl.
CPC .............. *H02M 1/08* (2013.01); *H01L 24/26* (2013.01); *H05K 1/0298* (2013.01); *H05K 1/144* (2013.01); *H02M 2001/0074* (2013.01)

(58) Field of Classification Search
None
See application file for complete search history.

(56) References Cited

U.S. PATENT DOCUMENTS

| | | | |
|---|---|---|---|
| 3,846,741 | A | 11/1974 | Kunkle et al. |
| 4,211,603 | A | 7/1980 | Reed |
| | | (Continued) | |

FOREIGN PATENT DOCUMENTS

| | | |
|---|---|---|
| EP | 2863531 | 4/2015 |
| JP | H02280666 | 11/1990 |
| | (Continued) | |

OTHER PUBLICATIONS

U.S. Appl. No. 14/731,287, filed Jun. 4, 2015, Vinciarelli et al.
(Continued)

*Primary Examiner* — Cassandra F Cox
(74) *Attorney, Agent, or Firm* — Fish & Richardson P.C.

(57) ABSTRACT

Encapsulated electronic modules having complex contact structures may be formed by encapsulating panels containing a substrate comprising pluralities of electronic modules delineated by cut lines and having conductive interconnects buried within terminal holes and other holes drilled in the panel within the boundaries of the cut lines. Slots may be cut in the panel along the cut lines. The interior of the holes, as well as surfaces within the slots and on the surfaces of the panel may be metallized, e.g. by a series of processes including plating. Solder may be dispensed into the holes for surface mounting. Two or more panels may be stacked prior to singulation to form module stacks. Multi-cell converters having a large cell pitch may be combined with an interconnection module to provide vertical power delivery to semiconductor devices through a semiconductor power grid having a small pitch. The converters and interconnection modules may be fabricated in panels and stacked prior to singulation.

113 Claims, 13 Drawing Sheets

Related U.S. Application Data is a continuation-in-part of application No. 15/091,346, filed on Apr. 5, 2016, now Pat. No. 10,158,357.

(56) References Cited

U.S. PATENT DOCUMENTS

| | | |
|---|---|---|
| 4,223,970 A | 9/1980 | Walter |
| 4,230,385 A | 10/1980 | Ammon et al. |
| 4,326,765 A | 4/1982 | Brancaleone |
| 4,394,711 A | 7/1983 | Conley |
| 4,526,429 A | 7/1985 | Kirkman |
| RE32,212 E | 7/1986 | Walter et al. |
| 4,742,477 A | 5/1988 | Phillips et al. |
| 4,917,526 A | 4/1990 | Paterson |
| 5,027,255 A | 6/1991 | Zeitlin |
| 5,168,432 A | 12/1992 | Murphy et al. |
| 5,321,351 A | 6/1994 | Swart et al. |
| 5,408,189 A | 4/1995 | Swart et al. |
| 5,438,294 A | 8/1995 | Smith |
| 5,471,366 A | 11/1995 | Ozawa |
| 5,481,436 A | 1/1996 | Werther |
| 5,728,600 A | 3/1998 | Vinciarelli et al. |
| RE36,442 E | 12/1999 | Kardos |
| 6,031,253 A | 2/2000 | Kobayashi |
| 6,031,743 A | 2/2000 | Carpenter et al. |
| 6,035,261 A | 3/2000 | Carpenter et al. |
| 6,110,213 A | 8/2000 | Vinciarelli et al. |
| 6,116,916 A | 9/2000 | Kasai |
| 6,118,186 A | 9/2000 | Scott et al. |
| 6,147,876 A | 11/2000 | Yamaguchi |
| 6,184,585 B1 | 2/2001 | Martinez et al. |
| 6,229,216 B1 | 5/2001 | Ma et al. |
| 6,230,403 B1 | 5/2001 | Skoolicas et al. |
| 6,275,958 B1 | 8/2001 | Carpenter et al. |
| 6,300,749 B1 | 10/2001 | Castelli et al. |
| 6,391,685 B1 | 5/2002 | Hikita et al. |
| 6,403,009 B1 | 6/2002 | Vinciarelli et al. |
| 6,421,262 B1 | 7/2002 | Saxelby et al. |
| 6,466,458 B2 | 10/2002 | Zhang et al. |
| 6,603,292 B1 | 8/2003 | Schouten et al. |
| 6,646,886 B1 | 11/2003 | Popovich et al. |
| 6,700,361 B2 | 3/2004 | Gregorius |
| 6,788,033 B2 | 9/2004 | Vinciarelli |
| 6,838,754 B2 | 1/2005 | Kim |
| 6,847,853 B1 | 1/2005 | Vinciarelli et al. |
| 6,911,848 B2 | 6/2005 | Vinciarelli |
| 6,930,893 B2 | 8/2005 | Vinciarelli et al. |
| 6,934,166 B2 | 8/2005 | Vinciarelli et al. |
| 6,940,013 B2 | 9/2005 | Vinciarelli et al. |
| 6,969,909 B2 | 11/2005 | Briere |
| 6,975,098 B2 | 12/2005 | Vinciarelli et al. |
| 6,984,965 B2 | 1/2006 | Vinciarelli et al. |
| 6,985,341 B2 | 1/2006 | Vinciarelli et al. |
| 7,015,587 B1 | 3/2006 | Poddar |
| 7,030,469 B2 | 4/2006 | Mahadevan et al. |
| 7,145,786 B2 | 12/2006 | Vinciarelli et al. |
| 7,187,263 B2 | 3/2007 | Vinciarelli et al. |
| 7,198,987 B1 | 4/2007 | Warren et al. |
| 7,245,509 B1 * | 7/2007 | Chan .................. H02M 7/538 363/17 |
| 7,294,007 B1 | 11/2007 | Lawlyes |
| 7,298,038 B2 | 11/2007 | Filoteo et al. |
| RE40,072 E | 2/2008 | Prager et al. |
| 7,361,844 B2 | 4/2008 | Vinciarelli et al. |
| 7,494,843 B1 | 2/2009 | Lin et al. |
| 7,521,909 B2 | 4/2009 | Dow et al. |
| 7,561,446 B1 | 7/2009 | Vinciarelli |
| 7,767,494 B2 | 8/2010 | Sasaki et al. |
| 7,768,807 B2 | 8/2010 | Chen et al. |
| 7,952,879 B1 | 5/2011 | Vinciarelli |
| 8,138,584 B2 | 3/2012 | Wang et al. |
| 8,232,783 B2 | 7/2012 | Yanagawa |
| 8,240,035 B2 | 8/2012 | Nishikawa |
| 8,288,846 B2 | 10/2012 | Narendra et al. |
| 8,427,269 B1 | 4/2013 | Vinciarelli et al. |
| 8,582,333 B2 | 11/2013 | Oraw et al. |
| 8,896,111 B2 | 11/2014 | Vinciarelli |
| 8,966,747 B2 | 3/2015 | Vinciarelli et al. |
| 9,087,656 B1 | 7/2015 | Vinciarelli |
| 9,107,290 B1 | 8/2015 | Chen |
| 9,112,422 B1 | 8/2015 | Vinciarelli |
| 9,166,481 B1 | 10/2015 | Vinciarelli et al. |
| 9,402,319 B2 | 7/2016 | Vinciarelli et al. |
| 9,439,297 B2 | 9/2016 | Vinciarelli |
| 9,516,761 B2 | 12/2016 | Vinciarelli et al. |
| 9,571,084 B1 | 2/2017 | Vinciarelli et al. |
| 9,584,026 B1 | 2/2017 | Vinciarelli et al. |
| 9,660,537 B1 | 5/2017 | Vinciarelli |
| 9,765,750 B2 | 9/2017 | Ferguson et al. |
| 9,936,580 B1 | 4/2018 | Vinciarelli et al. |
| 10,014,798 B1 | 7/2018 | Vinciarelli et al. |
| 10,020,752 B1 | 7/2018 | Vinciarelli et al. |
| 10,158,357 B1 | 12/2018 | Vinciarelli et al. |
| 1,023,133 A1 | 3/2019 | Liu et al. |
| 10,264,664 B1 | 4/2019 | Vinciarelli et al. |
| 10,277,105 B1 | 4/2019 | Vinciarelli et al. |
| 1,039,043 A1 | 8/2019 | Kudou et al. |
| 1,051,218 A1 | 12/2019 | Suzuki |
| 1,053,701 A1 | 1/2020 | Vinciarelli |
| 1,070,182 A1 | 6/2020 | Vinciarelli |
| 1,075,781 A1 | 8/2020 | Vinciarelli et al. |
| 1,079,164 A1 | 9/2020 | Vinciarelli |
| 2001/0018285 A1 | 8/2001 | Mizumura |
| 2001/0018286 A1 | 8/2001 | Mizumura |
| 2001/0023980 A1 | 9/2001 | Ohmori |
| 2001/0032388 A1 | 10/2001 | Morris |
| 2003/0058628 A1 | 3/2003 | Boylan |
| 2003/0087538 A1 | 5/2003 | Ueno |
| 2003/0162434 A1 | 8/2003 | Kamiya |
| 2003/0168499 A1 | 9/2003 | Tanabe et al. |
| 2003/0227280 A1 | 12/2003 | Vinciarelli et al. |
| 2004/0100778 A1 | 5/2004 | Vinciarelli et al. |
| 2004/0157410 A1 | 8/2004 | Yamaguchi |
| 2004/0207089 A1 | 10/2004 | Masuda |
| 2004/0251554 A1 | 12/2004 | Masuda |
| 2005/0048692 A1 | 3/2005 | Hanada et al. |
| 2005/0167814 A1 | 8/2005 | Beroz et al. |
| 2005/0184381 A1 | 8/2005 | Asahi |
| 2006/0127652 A1 | 6/2006 | Kanaya et al. |
| 2006/0133041 A1 | 6/2006 | Belady |
| 2006/0133042 A1 | 6/2006 | Belady |
| 2006/0180346 A1 | 8/2006 | Knight et al. |
| 2006/0272150 A1 | 12/2006 | Eguchi et al. |
| 2006/0291265 A1 | 12/2006 | Schrom et al. |
| 2007/0158799 A1 | 7/2007 | Chiu |
| 2007/0241440 A1 | 10/2007 | Hoang et al. |
| 2007/0297198 A1 | 12/2007 | Chang |
| 2008/0078572 A1 | 4/2008 | Watanabe et al. |
| 2008/0116589 A1 | 5/2008 | Li et al. |
| 2009/0016083 A1 | 1/2009 | Soldano et al. |
| 2009/0140394 A1 | 6/2009 | Bathan et al. |
| 2009/0251873 A1 | 10/2009 | Chenq |
| 2009/0321956 A1 | 12/2009 | Sasaki et al. |
| 2009/0321957 A1 | 12/2009 | Sasaki et al. |
| 2009/0325345 A1 | 12/2009 | Sasaki et al. |
| 2010/0072604 A1 | 3/2010 | Komatsu et al. |
| 2010/0172116 A1 | 7/2010 | Yorita |
| 2010/0246152 A1 | 9/2010 | Lin et al. |
| 2012/0287582 A1 | 11/2012 | Vinciarelli et al. |
| 2013/0030534 A1 | 1/2013 | DeLurio et al. |
| 2013/0069608 A1 | 3/2013 | Gakhar et al. |
| 2013/0083495 A1 | 4/2013 | Moon et al. |
| 2014/0152350 A1 | 6/2014 | Ikriannikov et al. |
| 2014/0218155 A1 | 8/2014 | Akre |
| 2014/0355218 A1 | 12/2014 | Vinciarelli et al. |
| 2015/0181719 A1 | 6/2015 | Vinciarelli et al. |
| 2015/0181727 A1 | 6/2015 | Vinciarelli |
| 2015/0188407 A1 | 7/2015 | Golder et al. |
| 2016/0128215 A1 | 5/2016 | Kanzaki et al. |
| 2016/0302312 A1 | 10/2016 | Vinciarelli et al. |
| 2017/0013748 A1 | 1/2017 | Saji et al. |
| 2017/0115144 A1 | 4/2017 | Watanabe et al. |
| 2017/0336584 A1 | 11/2017 | Ariga et al. |
| 2019/0080931 A1 | 3/2019 | Ito et al. |
| 2020/0253060 A1 | 8/2020 | Vinciarelli et al. |

(56) References Cited

U.S. PATENT DOCUMENTS

FOREIGN PATENT DOCUMENTS

| JP | H04293293 | 10/1992 |
| WO | WO 1995/027308 | 10/1995 |
| WO | WO 2012/155036 | 11/2012 |

OTHER PUBLICATIONS

U.S. Appl. No. 14/822,561, filed Aug. 10, 2015, Vinciarelli.
U.S. Appl. No. 14/874,054, filed Oct. 2, 2015, Vinciarelli.
Amendment after Allowance Pursuant to 37 C.F.R. §1.312 in U.S. Appl. No. 13/044,063, dated Mar. 3, 2015, 17 pages.
AN2738, Application Note AN2738, "L6390 half-bridge gate driver," STMicroelectronics, Aug. 2009.
AND8311/D (Understanding the LLC Structure in Resonant Applications, Christophe Basso, ON Semiconductor, Jan. 2008) (Year: 2008).
Brown (Point of Load Converters—The Topologies, Converters, and Switching Devices Required for Efficient Conversion, Jess Brown, Vishay Siliconix, Presented at PCIM Conference, May 2002) (Year: 2002).
Burton et al., "FIVR—Fully Integrated Voltage Regulators on 4th Generation Intel® CoreTM SoCs," In Applied Power Electronics Conference and Exposition (APEC), 2014 Twenty-Ninth Annual IEEE, Mar. 16, 2014, 432-439.
Cao et al., "A Family of Zero Current Switching Switched-Capacitor DC-DC converters," Applied Power Electronics Conference and Exposition (APEC), 2010 Twenty-Fifth Annual IEEE, Mar. 18, 2010.
Cao et al., "Zero-Current-Switching Multilevel Modular Switched-Capacitor DC-DC Converter" IEEE Transactions on Industry Applications, 46(6):2536-2544, Sep. 2010.
DiBene II et al., "A 400 Amp Fully Integrated Silicon Voltage Regulator with in-die Magnetically Coupled Embedded Inductors," retrieved from http://www.psma.com/sites/default/files/uploads/tech-forums-nanotechnology/resources/400a-fully-integrated-silicon-voltage-regulator.pdf, retrieved on Aug. 3, 2016, 25 pages.
European Office Action in European Application No. 16173089.0, dated Apr. 10, 2017, 2 pages.
Extended Search Report in European Application No. 16173089.0, dated Feb. 14, 2017, 8 pages.
ISL6210, Datasheet ISL6210, "Dual Synchronous Rectified MOSFET Drivers," Intersil Americas Inc., Dec. 2008.
Miller, "12V PowerStage in Embedded Die System-in-Package," APEC 2015, 33 pages.
Notice of Allowance in U.S. Appl. No. 13/044,063, dated Feb. 20, 2015, 15 pages.
Notice of Allowance in U.S. Appl. No. 13/044,063, dated Jun. 5, 2015, 11 pages.
Notice of Allowance in U.S. Appl. No. 14/682,187, dated Jan. 17, 2017, 22 pages.
Notice of Allowance in U.S. Appl. No. 15/091,346, dated Aug. 13, 2018, 8 pages.
Notice of Allowance in U.S. Appl. No. 15/091,346, dated May 21, 2018, 9 pages.
Notice of Allowance in U.S. Appl. No. 15/616,288, dated Dec. 11, 2018, 9 pages.
Office Action in U.S. Appl. No. 13/044,063, dated May 23, 2014, 24 pages.
Okudaira and Matsuse, "A New Quasi-Resonant Inverter With Two-way Short-circuit Switch Across a Resonant Capacitor," Power Conversion Conference 2002, 2002, 1496-1501.
Oraw et al., "Load Adaptive, High Efficiency, Switched Capacitor Intermediate Bus Converter," Telecommunications Energy Conference, IEEE 2007, pp. 628-635 Sep. 30-Oct. 4, 2007.
Reply to Action of May 23, 2014 in U.S. Appl. No. 13/044,063, dated Oct. 24, 2014, 39 pages.
Seeman et al., "Analysis and optimization of switched-capacitor dc-dc converters," Power Electronics, IEEE Transactions on, vol. 23, pp. 841-851, Mar. 2008.
Supplemental Notice of Allowability in U.S. Appl. No. 13/044,063, dated Apr. 20, 2015, 5 pages.
TND359 ("High-Efficiency 255W ATX Power Supply Reference Design Documentation Package," ON Semiconductor, Jan. 2009) (Year: 2009).
Watson, "New Techniques in the Design of Distributed Power System," Dissertation, 1998, 32 pages.
Yeung et al., "Generalised analysis of switched-capacitor step-down quasi-resonant converter," Electronics Letters, vol. 38, pp. 263-264, 2002.
Yeung et al., "Zerocurrent switching switched-capacitor quasiresonant step-down converter," Electric Power Applications, IEE Proceedings-, vol. 149, pp. 111-121, 2002.
Braun et al. "Opportunities of Wafer Level Embedded Technologies for MEMS Devices"; SEMI MEMS Tech Seminar; (possibly published on Sep. 26, 2013); 22 pages.
"Ideas for attaching / connecting / stacking one PCB onto another with no gap"; http://electronics.stackexchange.com/questions/45733/ideas-for-attaching-connecting-stacking-one-PCB-onto-another-with-no-gap; accessed on Jun. 3, 2015; 5 pages.
PCT International Search Report and Written Opinion, PCT/US2012/37495, dated May 6, 2013, 18 pages.
USPTO Office Action in U.S. Appl. No. 13/105,696, dated Sep. 25, 2013, Examiner Arbes, 8 pages.
USPTO Office Action in U.S. Appl. No. 14/116,642, dated Feb. 9, 2016, Examiner Shrestha, 15 pages.
USPTO Office Action in U.S. Appl. No. 14/635,420, dated Oct. 22, 2015, Examiner Arbes, 6 pages.

\* cited by examiner

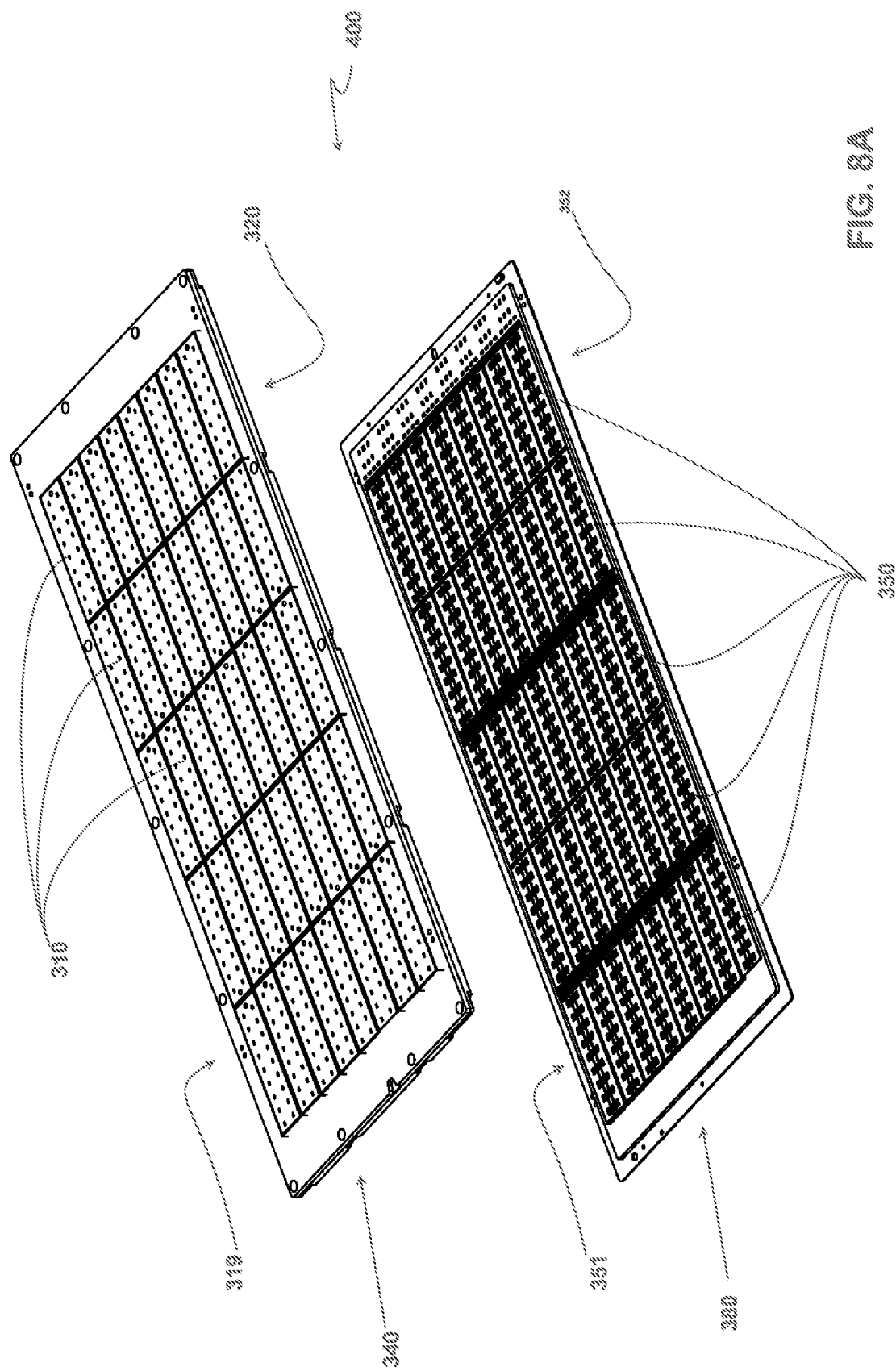

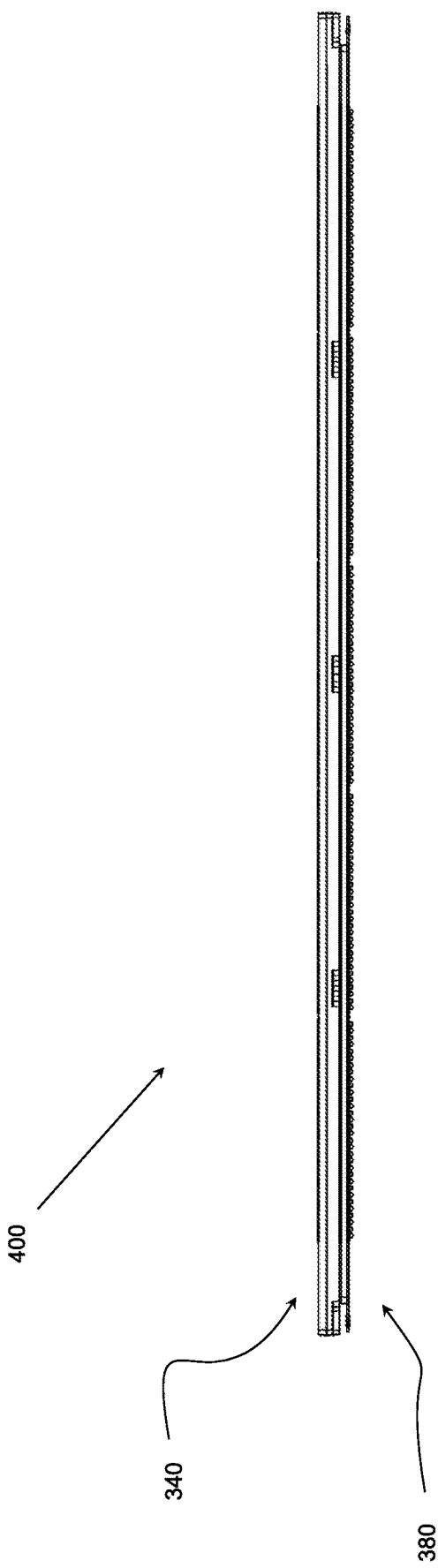

DELIVERING POWER TO SEMICONDUCTOR LOADS

CROSS-REFERENCE TO RELATED APPLICATION

This is a continuation-in-part of U.S. patent application Ser. No. 15/616,288, filed on Jun. 7, 2017 which is a continuation-in-part of U.S. patent application Ser. No. 15/091,346, filed on Apr. 5, 2016, both of which are hereby incorporated in their entirety by reference.

FIELD OF THE INVENTION

This invention relates to the field of powering semiconductor loads such as including CPUs, GPUs, ASICs, and wafer scale devices and more particularly to providing power encapsulated electronic assemblies, including encapsulated power converters.

BACKGROUND

In contemporary electronic systems, space is at a premium on customer circuit boards, e.g. on a circuit board near a processor. Additionally, efficiency and thermal management considerations place limits on the power dissipation of power supplies at, or near, the point of load. Many very large scale integrated ("VLSI") semiconductor dies such as central processing units ("CPU"), graphics processing units ("GPU"), and application specific integrated circuits ("ASIC") are mounted to a multilayer ceramic substrate which translates the electrical connections from the die to larger connections suitable for interfacing with a customer motherboard. As feature sizes decrease and transistor counts increase, so too do the power supply current requirements for such large chips. Current requirements for a typical CPU can easily exceed 200 amps and for a typical GPU exceeding 500 amps creating challenges for the package and system designers to efficiently supply such high currents. For example, power connections between the component package (such as a chip carrier or substrate or other package in or on which the semiconductor die is mounted) and the printed circuit board (PCB) on which the package is mounted may demand a large number of connector pins, leads, solder bumps, etc., to carry very high currents challenging package designers to accommodate both power and signal requirements. In many cases the large number and high frequency demands of signals may limit the maximum voltage, e.g. the interlayer breakdown voltage, to which the substrate or package may be subjected, in some cases as low as a few volts, further challenging power connections to and within the package or substrate.

SUMMARY

In general, in one aspect, a method of powering a semiconductor device having power input terminals is provided. The method includes providing a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals. The method includes providing an interconnection module having x-input terminals arranged on a first side of the interconnection module in a pattern configured to align with the first pattern of converter output terminals, and x-output terminals arranged on a surface of a second opposite side of the interconnection module in a second pattern configured to align with the power input terminals of the semiconductor device, the second pattern having a second spacing between x-output terminals, the second spacing being different than the first spacing, the x-input terminals being electrically connected to the x-output terminals; and assembling the power conversion module to the first side of the interconnection module with each converter output terminal mated with and electrically connected to a respective x-input terminal. The interconnection module is configured to provide electrical and mechanical translation between the converter output terminals arranged in the first pattern and the power input terminals of the semiconductor device arranged in the second pattern. The power conversion module and the interconnection module are stacked to form a module sandwich including the power conversion module in a first layer, electrical connections between the converter output terminals and the x-input terminals in a second layer, and the interconnection module in a third layer.

Implementations of the aspect can include one or more of the following features. The interconnection module can further include filter circuitry connected to the x-input terminals and the x-output terminals. The interconnection module can further include a multilayer printed circuit board ("PCB"), and the filter circuitry can include a plurality of capacitors mounted to a first surface of the PCB on the first side of the interconnection module. The second spacing can be less than the first spacing. Each conversion cell can further include a first dimension and the first spacing can be configured as a function of the first dimension. Each conversion cell can further include a second dimension, the first spacing can further include a latitudinal spacing and a longitudinal spacing, and the latitudinal spacing can be a function of the first dimension and the longitudinal spacing can be a function of the second dimension. The method can further include configuring the conversion circuitry as a buck converter having a plurality of phases with each conversion cell configured to operate as a selected one of the phases. The method can further include configuring the conversion circuitry to convert power received from an input to the power conversion module at an input voltage, VIN, and input current, TIN, for delivery to the converter output terminals at an output voltage, VOUT, and an output current, IOUT, using a transformation ratio, K, where K=VOUT/VIN, that is essentially constant, subject to an equivalent output resistance.

The method can further include encapsulating the conversion circuitry to form a first surface of the power conversion module, encapsulating the interconnection module to form a first surface on the first side of the interconnection module, affixing the first surface of the power conversion module to the first surface of the interconnection module with the converter output terminals and the x-input terminals aligned using an adhesive, and forming solder connections between respective one of the output terminals and the x-input terminals. The interconnection module can further include a multilayer printed circuit board ("PCB") and the method can further include mounting at least one solder ball to the PCB for each x-output terminal. The interconnection module can further include a multilayer printed circuit board ("PCB") and the method can further include mounting at least one conductive pin to the PCB for each x-output terminal. The interconnection module can further include a multilayer printed circuit board ("PCB") and the method can further include providing the x-output terminals in a land grid array on the PCB.

The method can further include attaching the semiconductor device to the interconnection module with the x-output terminals aligned with and electrically connected to respective ones of the power input terminals; and wherein the connections between the x-output terminals and the power input terminals form a fourth layer in the module sandwich. The method can further include assembling a first panel comprising a plurality of unsingulated power conversion modules; and assembling a second panel comprising a plurality of unsingulated interconnection modules; wherein the assembling of the power conversion module and the interconnection module is performed using the first and second panels prior to singulation to form a panel sandwich and further comprises dispensing epoxy between the first and second panels and forming solder connections between each converter output terminal and each respective x-input terminal. The method can further include cutting the panel sandwich along predetermined cut lines to singulate a plurality of the module sandwiches. The dispensing of epoxy can further include dispensing epoxy on the surface of at least one of the panels along the cut lines. The method can further include reflowing solder and curing the epoxy.

The method can further include arranging the x-output terminals with alternating polarities. In some example, the method can further include arranging the x-output terminals with polarities that alternate between adjacent columns. In some examples, the method can further include arranging the x-output terminals with polarities that alternate between adjacent rows. In some examples, the method can further include arranging the x-output terminals with polarities that alternate between adjacent x-output terminals. The method can further include arranging the converter output terminals with alternating polarities. In some examples, the method can further include arranging the converter output terminals with polarities that alternate between rows. In some examples, the method can further include arranging the converter output terminals with polarities that alternate between columns. In some examples, the method can further include arranging the converter output terminals with polarities that alternate between adjacent converter output terminals.

In general, in another aspect, a method of making power converters is provided. The method includes assembling an encapsulated panel including a printed circuit board ("PCB") having electronic components mounted to the PCB and a plurality of conductive features enclosed within the panel and unexposed to an exterior surface of the panel, the panel comprising one or more power conversion modules having boundaries defined by one or more predetermined cut lines; configuring each of the one or more power conversion modules in a multi-cell structure having a plurality of conversion cells, each conversion cell including one or more converter output nodes, wherein the output nodes are arranged in a first pattern having a first spacing between the output nodes, and wherein each output node is electrically connected to a respective conductive feature; selectively forming a plurality of holes in the exterior surface of the panel, each hole being formed at a respective predetermined location aligned with a respective output node, spaced apart from the cut lines, and exposing within the hole the respective conductive feature; selectively forming one or more conductive metal layers on the exterior surface of the panel including within the plurality of holes, the one or more conductive metal layers within each hole being in electrical contact with the respective conductive feature, to form a plurality of electrical contacts on the exterior surface of the panel; patterning the one or more conductive metal layers on the exterior surface to electrically isolate at least one electrical contact from one or more of the plurality of electrical contacts; and cutting the panel along the one or more cut lines to singulate the one or more power conversion modules, each singulated power conversion module having a respective plurality of the electrical contacts formed on the exterior surface of the module.

Implementations of the aspect can include one or more of the following features. The method can further include selectively filling the plurality of holes with solder. The method can further include planarizing the solder to a predetermined height relative to the exterior surface. Each conversion cell can further include a first dimension and a second dimension, the first spacing can further include a latitudinal spacing and a longitudinal spacing, and the latitudinal spacing can be a function of the first dimension and the longitudinal spacing can be a function of the second dimension.

The method can further include: providing an interconnection module having x-input terminals arranged on a first surface of the interconnection module in a pattern configured to align with the first pattern of converter output terminals, and x-output terminals arranged on a second surface in a second pattern, the second pattern having a second spacing between the x-output terminals, the second spacing being different than the first spacing, the x-input terminals being electrically connected to the x-output terminals; and assembling the first surface of the interconnection module to the power conversion module with each converter output terminal mated with and electrically connected to a respective x-input terminal, wherein the power conversion module and the interconnection module are stacked to form a sandwich structure including the power conversion module in a first layer, electrical connections between the converter output terminals and the x-input terminals in a second layer, and the interconnection module in a third layer. The method can further include assembling the sandwich structure to a substrate with the x-output terminals aligned with and electrically connected to respective terminals on a surface of the substrate. The substrate can include a semiconductor device electrically connected to receive power from the power conversion module.

In general, in another aspect, a method of making electronic assemblies is provided. The method can include: providing an electronic module having electronic circuitry including circuit terminals arranged in a first pattern having a first spacing between the circuit terminals; providing an interconnection module having x-input terminals arranged on a first surface of the interconnection module in a pattern configured to align with the first pattern of circuit terminals, and x-output terminals arranged on a second surface in a second pattern configured to align with external terminals of a third electronic device, the second pattern having a second spacing between the x-output terminals, the second spacing being different than the first spacing, the x-input terminals being electrically connected to the x-output terminals; and assembling the electronic module to the first surface of the interconnection module with each circuit terminal mated with and electrically connected to a respective x-input terminal. The interconnection module is configured to provide electrical and mechanical translation between the circuit terminals arranged in the first pattern and the external terminals of the third electronic device arranged in the second pattern. The electronic module and the interconnection module are stacked to form a module sandwich including the electronic module in a first layer, electrical connections between the circuit terminals and the x-input terminals in a second layer, and the interconnection module in a third layer. The method includes assembling a first panel comprising a plurality of unsingulated electronic modules; and assembling a second panel comprising a plurality of unsingulated interconnection modules; wherein the assembling of the electronic module and the interconnection module is performed using the first and second panels prior to singulation to form a panel sandwich and further comprises dispensing a curable adhesive compound between the first and second panels and forming solder connections between each circuit terminal and each respective x-input terminal. The method includes cutting the panel sandwich along predetermined cut lines to singulate a plurality of the module sandwiches.

Implementations of the aspect can include one or more of the following features. The dispensing of the curable adhesive compound can further include dispensing the curable adhesive compound on the surface of at least one of the panels along the cut lines. The method can further include reflowing solder and curing the adhesive compound.

In another general aspect, a method of forming modular circuit assemblies is provided. The method includes: assembling first and second encapsulated panels each including a first multilayer printed circuit board ("PCB") having a plurality of conductive layers, a first plurality of electronic components mounted to a first surface of the PCB, and a first layer of cured encapsulant covering the first plurality of electronic components and the surface of the PCB, the first layer of cured encapsulant forming a first exterior surface of the encapsulated panel, the encapsulated panel comprising a plurality of unsingulated electronic modules, each electronic module having perimeter boundaries defined by one or more predetermined cut lines; selectively forming a plurality of terminal holes in the first exterior surface of each panel through the first layer at predetermined locations within the perimeter boundaries of each electronic module, each terminal hole being spaced apart from the cut lines and exposing within the terminal hole a respective conductive feature; selectively forming one or more conductive metal layers on the first exterior surface of each panel including within the plurality of terminal holes, the one or more conductive metal layers within each terminal hole being in electrical contact with the respective conductive feature; patterning the one or more conductive metal layers on the exterior surface, to form a plurality of electrical contacts on the exterior surface of each panel electrically isolated from at least one other electrical contact in the plurality of electrical contacts; assembling the first and second encapsulated panels with electrical contacts on the first panel aligned and mated with respective electrical contacts on the second panel to form a panel stack, the panel stack comprising a plurality of un-singulated module stacks, each module stack including an unsingulated electronic module in the first panel and a respective unsingulated electronic module in the second panel; and cutting the panel stack along the one or more cut lines to singulate the plurality of electronic module stacks.

Implementations of the aspect can include one or more of the following features. The method can further include dispensing a curable adhesive compound on the surface of at least one of the panels along the cut lines. The method can further include reflowing solder and curing the adhesive compound.

In another general aspect, an apparatus includes: a semiconductor device having power input terminals; a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals; and an interconnection module having x-input terminals arranged on a first surface of the interconnection module in a pattern configured to align with the first pattern of converter output terminals, and x-output terminals arranged on a second surface in a second pattern configured to align with the power input terminals of the semiconductor device, the second pattern having a second spacing between x-output terminals, the second spacing being different than the first spacing, the x-input terminals being electrically connected to the x-output terminals. The converter output terminals of the power conversion module is mated with and electrically connected to respective x-input terminals of the interconnection module. The interconnection module is configured to provide electrical and mechanical translation between the converter output terminals arranged in the first pattern and the power input terminals of the semiconductor device arranged in the second pattern. The power conversion module and the interconnection module are stacked with the power conversion module located at a first level, electrical connections between the converter output terminals and the x-input terminals at a second level, and the interconnection module at a third level.

Implementations of the aspect can include one or more of the following features. The semiconductor device can include a die, a wafer, or a substrate. The semiconductor device can include a semiconductor die or package mounted to a substrate.

In another general aspect, a method of powering a semiconductor device having power input terminals is provided. The method includes: providing a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals; and providing an interconnection module having x-input terminals arranged on a first surface of the interconnection module in a pattern configured to align with the first pattern of converter output terminals, and x-output terminals arranged on a second surface in a second pattern configured to align with the power input terminals of the semiconductor device, the second pattern having a second spacing between x-output terminals, the second spacing being different than the first spacing, the x-input terminals being electrically connected to the x-output terminals. The method further includes providing a plurality of conductive pillars for electrically connecting the converter output terminals with respective x-input terminals; and assembling the power conversion module to the interconnection module with each converter output terminal aligned with and electrically connected to a respective x-input terminal by a respective one of the conductive pillars. The interconnection module is configured to provide electrical and mechanical translation between the converter output terminals arranged in the first pattern and the power input terminals of the semiconductor device arranged in the second pattern. The power conversion module and the interconnection module are stacked to form a module sandwich including the power conversion module in a first layer, the conductive pillars connecting the converter output terminals and the x-input terminals in a second layer, and the interconnection module in a third layer. The x-output terminals are arranged with alternating polarities to reduce interconnection inductance. The method can further include arranging the x-output terminals with alternating polarities. The method can further include arranging the converter output terminals with alternating polarities.

BRIEF DESCRIPTION OF DRAWINGS

FIG. 8A is an exploded view of a panel sandwich assembly including a panel of converter modules and a panel of the interconnection modules.

FIG. 8B is side view of the panel sandwich assembly.

Like reference numbers and symbols in the various drawings indicate like elements.

DETAILED DESCRIPTION

Figure 1:
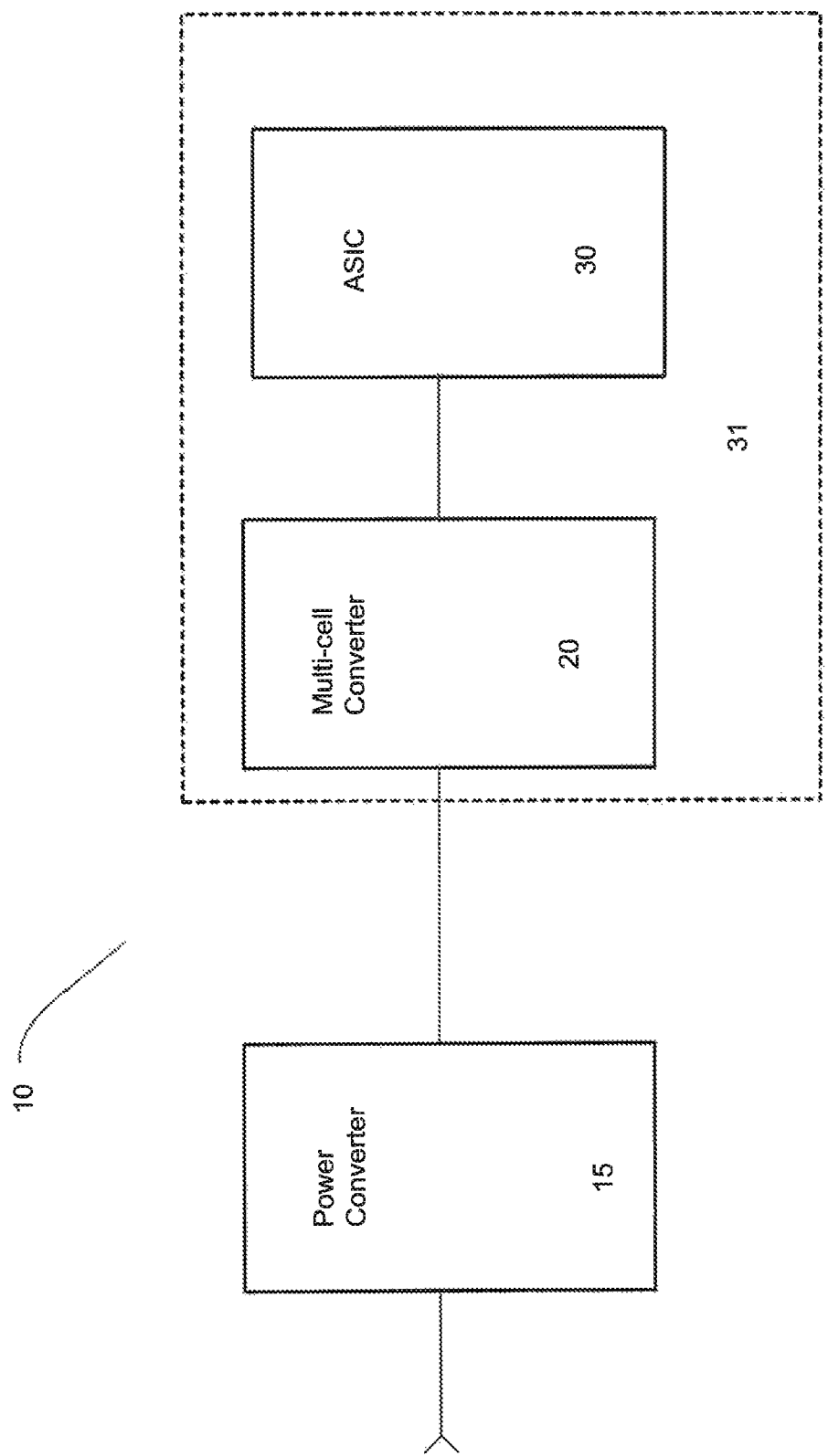
FIG. 1 shows a block diagram of a system for powering a semiconductor load such as a CPU, GPU, ASIC, or other high current demanding load.

A schematic block diagram of a system for powering a semiconductor load, such as a high-power ASIC, is shown in FIG. 1. As shown, the power system 10 may include a first power converter 15 connected to convert power received from a source, e.g. a system power bus, (not shown) for delivery to a second stage converter 20 which converts power for delivery to the semiconductor load, e.g. ASIC 30. As shown the second stage converter 20 is preferably mounted in close proximity to the point of load ("PoL"), for example on or in the same package or assembly, e.g. assembly 31, as the ASIC 30. Preferably, power conversion stage 15 is a switching regulator having a nominal output voltage at or near 48 Volts DC, and the second conversion stage is a fixed-ratio switching converter which converts the 48 VDC input to the low voltage required by the semiconductor, e.g. typically ranging from less than 2 VDC to less than 1 VDC.

A Factorized Power Architecture well suited for supplying power to low voltage high current loads is described in Vinciarelli, Factorized Power with Point of Load Sine Amplitude Converters, U.S. Pat. No. 6,975,098, issued Dec. 13, 2005 (the "Micro FPA Patent") and U.S. Pat. No. 6,984,965, issued Jan. 10, 2006 (the "FPA Patent") (both assigned to VLT, Inc. of Andover, Mass., and the entire disclosure of each patent is incorporated herein by reference). Power converters which function as DC-to-DC transformers called Voltage Transformation Modules ("VTM") and Sine Amplitude Converters ("SAC") which have a transfer function approximating $V_O=K_{VTM}*Vin-Io*R_{VTM}$ are described in Vinciarelli, Factorized Power with Point of Load Sine Amplitude Converters, U.S. Pat. No. 6,930,893, issued Aug. 16, 2005 (the "SAC Patent") and in Vinciarelli, Point of Load Sine Amplitude Converters and Methods, U.S. Pat. No. 7,145,786, issued Dec. 5, 2006 (the "POL SAC Patent") (both assigned to VLT, Inc. of Andover, Mass., the entire disclosure of each patent is incorporated herein by reference).

In-package and on-package power conversion topologies are described in Vinciarelli et al., Method and Apparatus for Delivering Power to Semiconductors, U.S. Ser. No. 15/091,346 filed on Apr. 5, 2016 (the "MCM disclosure"); and in U.S. Ser. No. 15/616,288 filed on Jun. 7, 2017 (the multi-rail disclosure"); (collectively the "PoP" disclosures) both of which are assigned to VLT, Inc. of Andover, Mass., the entire disclosure of each is incorporated herein by reference. As discussed in connection with FIGS. 15A and 15B of the MCM disclosure, the fixed-ratio power converter may be mounted to the backside of the semiconductor package in the same or similar footprint of the semiconductor die to deliver power vertically to the semiconductor die.

Figure 2:
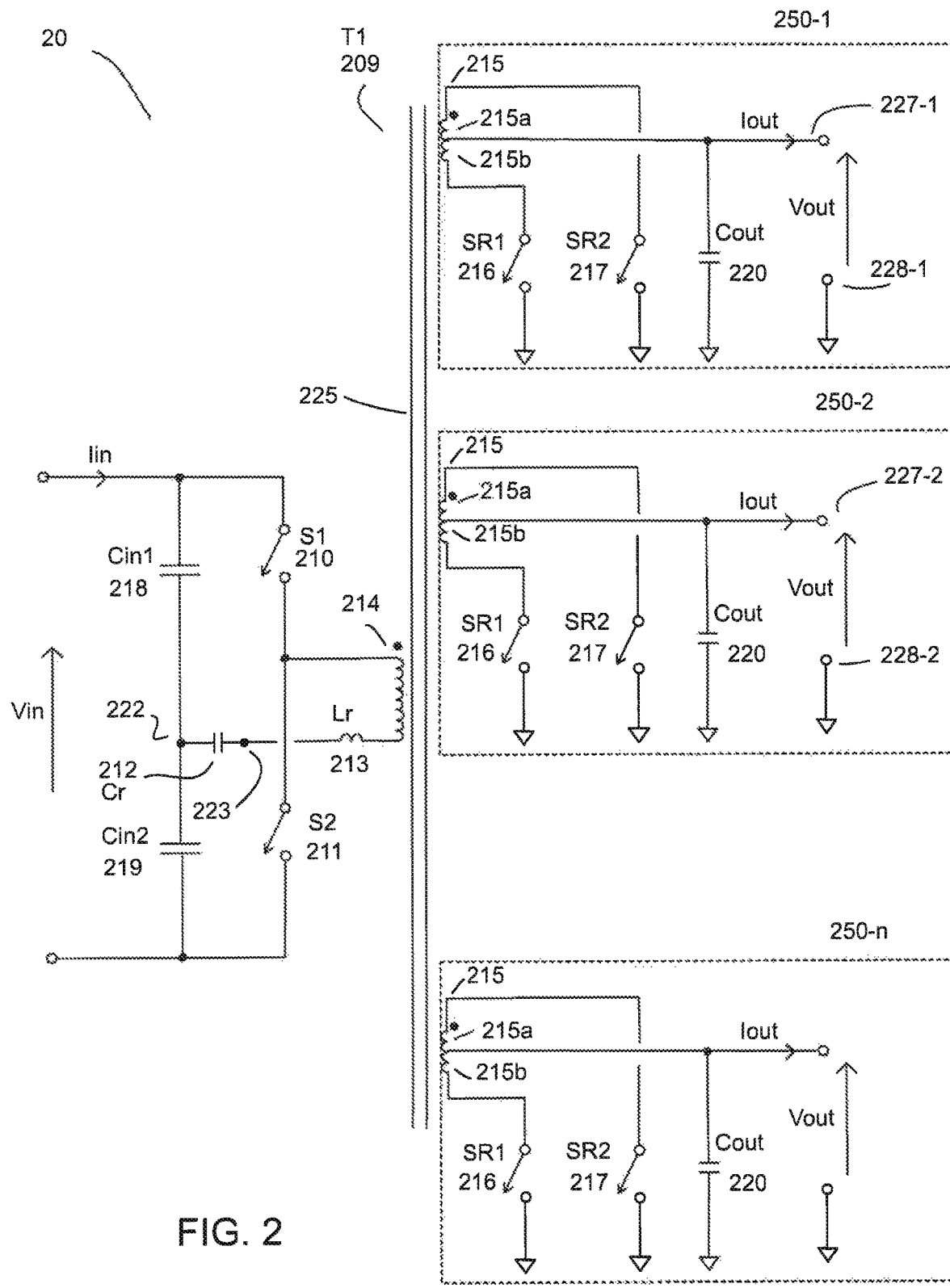
FIG. 2 shows a schematic diagram of a multi-cell converter.

Referring to FIG. 2, a multi-output cell fixed-ratio converter adapted for use as the second stage converter 20 is shown schematically. As shown in FIG. 2, a single half-bridge input circuit drives the primary winding 214 of transformer T1 209 with power received at the input voltage Vin. A plurality of output cells 250-1, 250-2, 250-n are shown having respective secondary windings 215 coupled to the transformer core 225 to receive power from the primary via the transformer. In the example shown, each secondary winding is center tapped comprising two windings 215a and 215b. It is assumed in the example shown that all of the secondary windings 215 (215a, 215b) have an equal number of turns providing a uniform turns ratio in each of the output cells 250. The outputs 227, 228 from each output cell may be connected in parallel to provide the required output current to the die. In each output cell two synchronous rectifier switches SR1 and SR2 selectively couple their respective winding 215a, 215b to complete the circuit providing full wave rectification. A switch controller (not shown) operates the primary switches S1 210 and S2 211 in the input circuit and the secondary switches SR1 216 and SR2 217 in each of the output cells in a series of converter operating cycles. Preferably the multi-cell converter uses the SAC topology described more fully in the SAC patent. Some or all of the input circuit may be located remotely from the transformer and output cells as described in Vinciarelli, Driver and Output Circuit for Powering Semiconductor Loads, U.S. Pat. No. 10,014,798 issued Jul. 3, 2018, assigned to VLT, Inc. of Andover, Mass., and incorporated in its entirety here (the "Remote Driver Patent") and in the MCM disclosure.

Figure 3:
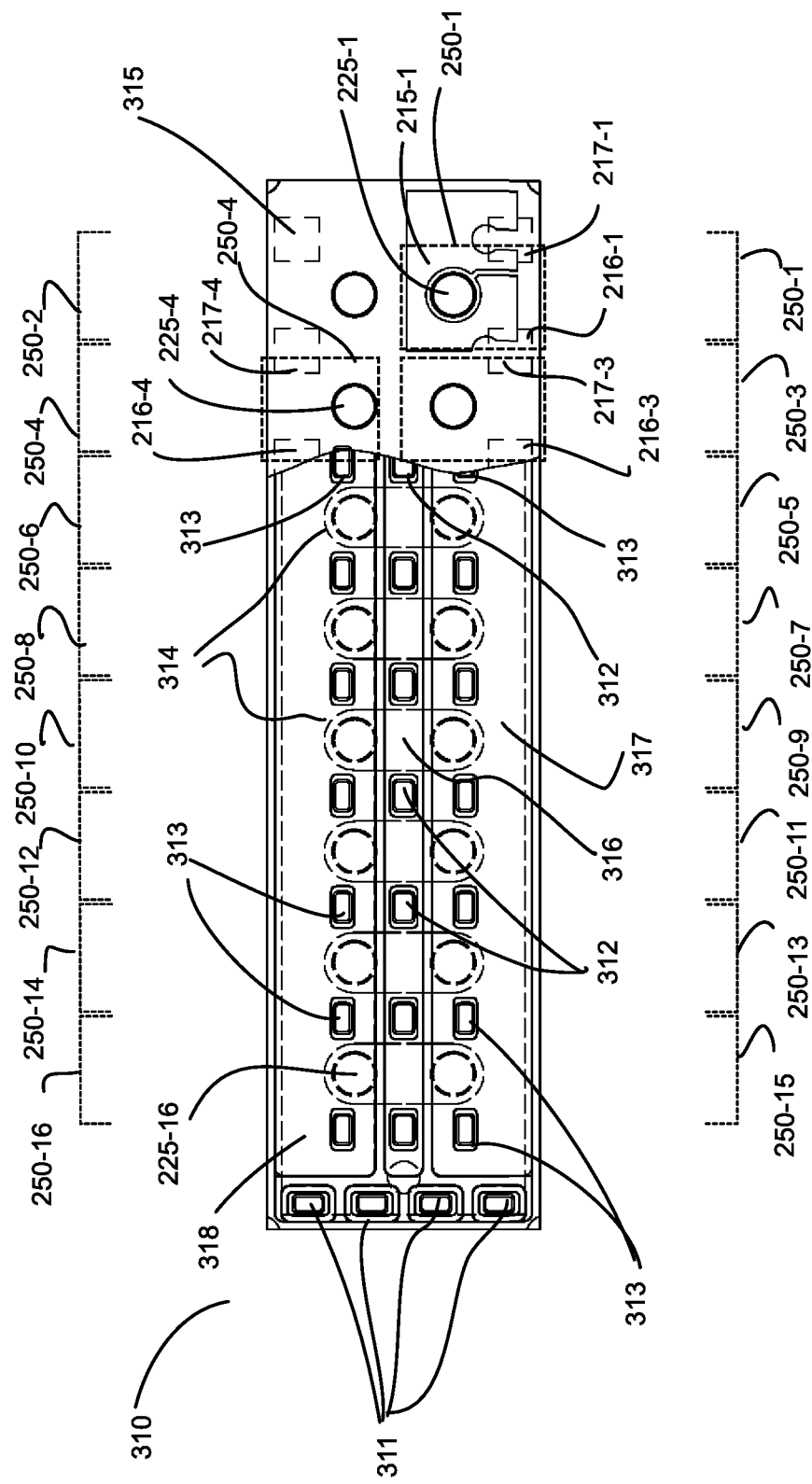
FIG. 3 shows a multi-cell converter module package.
Figure 5A:
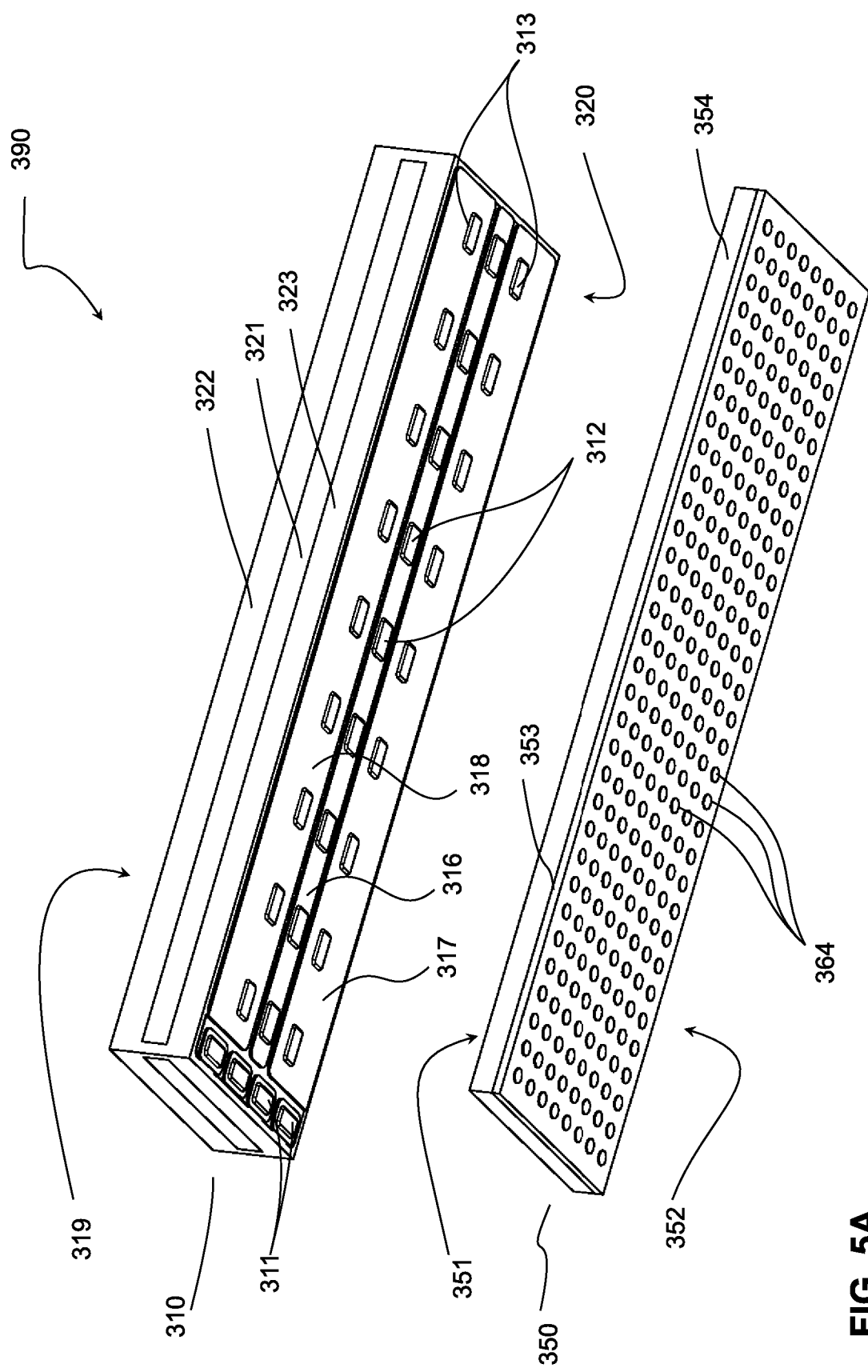
FIG. 5A and FIG. 5B show top and bottom isometric views of an exploded converter assembly including a multi-cell converter module and an interconnection module.
Figure 5B:
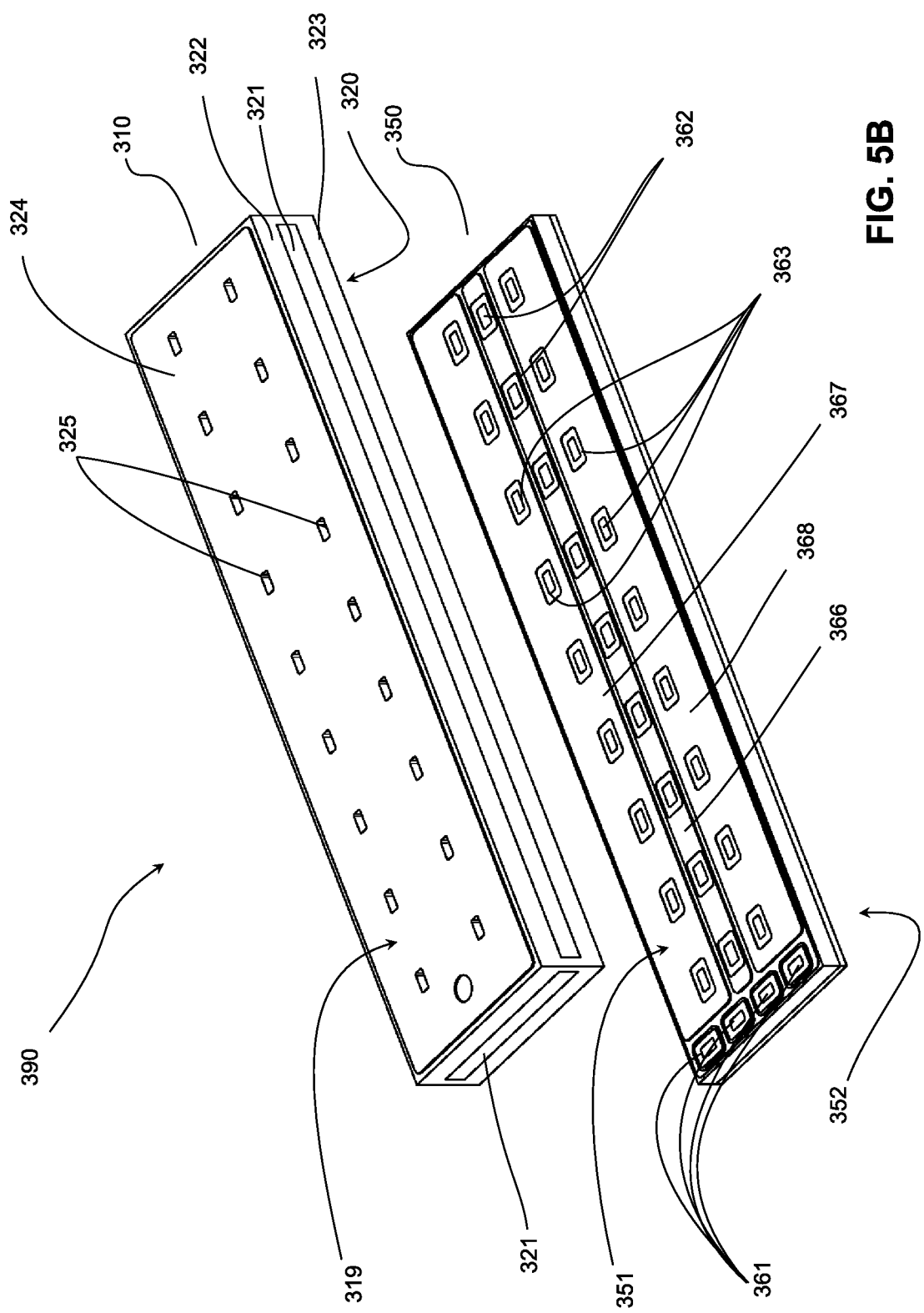

Preferably, the transformer and output cells of the multi-cell power converter may be formed on a multi-layer printed circuit board ("PCB") 321 and encapsulated to form a package amenable to mount directly to the semiconductor load. For example, as shown in FIG. 3, the multi-cell converter 310 is shown in an encapsulated package having a generally rectangular outline or footprint. FIGS. 5A and 5B show edges of the internal PCB 321 of the converter 310 sandwiched between two cured encapsulant layers 322 and 323. One of the large surfaces 320 of the converter 310 is shown in FIG. 5A including a plurality of electrical terminations which will be discussed in more detail below in connection with FIG. 3. The other large surface 319 of the converter 310 is shown in FIG. 5B having a conductive layer 324 covering a majority of the surface 319 and which preferably may be electrically connected to a common terminal, e.g. using one or more electrical and thermal connections 325, to provide EMI shielding and also enhance thermal performance. For example, the surface 319 may be mated with a cold plate or heat sink. Encapsulated packages of the type shown in FIGS. 3, 5A, and 5B, amenable for housing the multi-cell power converter in a format suitable for in-package and on-package applications is described in Vinciarelli et al., Panel Molded Electronic Assemblies with Multi-Surface Contacts, U.S. patent application Ser. No. 14/731,287 filed Jun. 4, 2015 (the "Leadless Disclosure") and in Vinciarelli et al., Panel Molded Electronic Assemblies with Integral terminals, U.S. patent Appln. Ser. No. 16/218, 395, filed Dec. 12, 2018, (the "Trench Disclosure") both of which are assigned to VLT, Inc. of Andover, Mass., the entire disclosure of each is incorporated herein by reference.

The multi-layer PCB may include a plurality of conductive layers on which the transformer windings may be formed. Referring to the schematic diagram of FIG. 2, the transformer 209 includes a single primary winding 214 driving the transformer core 225 to which are coupled the plurality (one for each output cell 250) of center-tapped secondary windings 215, each including windings 215a and 215b. One example PCB layer stack-up may have a primary winding (P) on the top outer conductive layer, a first set of secondary windings (Sa) on the second layer, a second set of secondary windings (Sb) on the third layer, a primary winding (P) on the fourth layer, a first set of secondary windings (Sa) on the fifth layer, a second set of secondary windings (Sb) on a sixth layer, a primary winding (P) on the seventh layer, and so on. In this example, the primary windings may be connected in series to divide the input voltage and the secondary windings connected in parallel to multiply the output current and reduce output resistance. Preferable PCB transformer structures for use in the multi-cell converter are described in Vinciarelli, Printed Circuit Transformer, U.S. Pat. No. 7,187,263 issued Mar. 6, 2007 assigned to VLT, Inc. of Andover, Mass., and incorporated by reference in its entirety here (the "Racetrack" patent).

The multi-cell converter example shown in FIG. 3 includes sixteen output cells, e.g. cells 250-1, 250-2, 250-3, 250-4 . . . 250-16, distributed in two horizontal rows and eight vertical columns in the orientation illustrated by the brackets shown in broken lines. A portion of the right side of the module 310 is shown cutaway to reveal portions of the output cell structure. Referring to output cell 250-1, a single turn winding 215-1 is shown surrounding a core leg 225-1. As shown, the footprint of semiconductor dice, e.g. die 315, lie on the border of the output cells 250, and referring to output cell 250-1 for example, overlap portions of the respective secondary windings, e.g. winding 215-1. In the layout of FIG. 3, each semiconductor die includes two devices, which may for example be MOSFET switches, used to implement the synchronous rectifiers (SR1 216 and SR2 217: FIG. 2). Accordingly, the die located between output cells 250-3 and 250-1 for example is labeled to show that switches 217-3 (on the left) and 216-1 (on the right), corresponding to switches SR2 of output cell 250-3 and SR1 of output cell 250-1 reside in that location. Note that the dice at the far ends of the multi-output cell converter 310 are not shared between adjacent cells, allowing both switches to be connected in parallel, providing lower output resistance in the cells at the ends of the converter, which as described below may force better current distribution. Preferably, the dice are located on the top (shown) and bottom (not shown) PCB surfaces for improved electrical and thermal performance, e.g. as described in Vinciarelli et al., Encapsulated Modular Power Converter with Symmetrical Heat Distribution, U.S. Pat. No. 9,516,761 issued Dec. 6, 2016, assigned to VLT, Inc. of Andover, Mass., and incorporated by reference in its entirety here (the "Symmetrical Patent").

Although only a single turn winding 215-1 is shown in cell 250-1 in FIG. 3, it should be understood that each output cell 250 may include a center-tapped winding (windings 215 as shown in FIG. 2) comprising two individual single turn windings (215a and 215b: FIG. 2), each of which, as described above in the exemplary PCB stack-up, may comprise a plurality of single turns connected in parallel to form lower resistance single turn windings. In the layout shown in FIG. 3, both halves of each center-tapped secondary, e.g. center-tapped secondary 215-1, may be coupled to a single core leg, e.g. core leg 225-1, allowing placement of the synchronous rectifier for each half winding (215a, 215b: FIG. 2) to be located at opposite edges of the output cell, e.g. 217-1, 216-1 in FIG. 3, respectively. In FIG. 3, the outline of output cells 250-1, 250-3, and 250-4 are shown with broken lines to generally indicate the boundaries of each cell, however, it should be understood that each cell may share features with adjacent cells.

The power output terminations 312, e.g. positive, and 313, e.g. common, may be distributed on the generally planar top surface of the encapsulated converter for vertical power delivery. As shown in FIG. 3, nine positive terminations 312 and eighteen common terminations 313 provide a total of twenty-seven power connections distributed in an array of nine columns and three rows. (The last two columns on the right-hand side of the drawing are not shown in FIG. 3 to provide cut-away details.) Note that in the example of FIG. 3, all of the terminations in a row are connected together by metal on the surface of the encapsulant 323, e.g. metal strips 317 and 318 respectively connect all of the termination 313 in the bottom and top rows and metal 316 connects all of the terminations in the middle row.

At the left-most side of the encapsulated module 310, an additional column of four electrical terminations, e.g. terminations 311, are shown to provide control and power input connections to the converter. For example, two of the terminations 311 may be used as power input terminations, e.g. to provide connections to the primary winding (214 in FIG. 2) of the transformer 209; and two of the terminations 311 may be used as control terminations, e.g. to provide connections to the control terminals of the synchronous rectifiers (SR1 216 and SR2 217 in FIG. 2), which may e.g. be the gates of MOSFETs used to implement the synchronous rectifiers, where the switch controller is located separately from the encapsulated module 310.

As shown in FIG. 3, magnetically permeable core pieces 314 (shown as broken oval lines) are disposed between each columnar set of power terminations. Beneath each core piece are circular core legs 225, e.g. 225-1, 225-4 and 225-16, arranged in pairs. The core legs extend through the PCB and are surrounded by the respective electrical windings as described above and in the Racetrack patent. In the layout shown, it will be appreciated that each output cell occupies a single core leg, that pairs of output cells share core pieces, and that output terminations 312, 313 are shared by adjacent output cells. For example, the windings of output cell 250-1 surround core leg 225-1; output cells 250-9 and 250-10 share a core piece 316 (shown on top) and another core piece (not shown) on the bottom of the module; cells 250-13, 250-14, 250-15, and 250-16 are all connected to the positive output termination 312 between them (as well as other positive output terminations), etc. It will be appreciated from the layout of FIG. 3, that there is a natural output termination pitch that results from the multi-cell output structure of the converter. For example, the lateral (or longitudinal) spacing between output termination columns is a function of the individual output cell geometry. Similarly, the vertical (or latitudinal) spacing between output termination rows is a function of, among other things, the individual cell geometry.

For supplying the extremely large and fast load changes common for modern large format semiconductor devices, the interconnection impedance between the converter output terminals and the semiconductor device should be as low as possible. One way of reducing the impedance of the power connections between the power converter and the semiconductor device is to use interdigitated vertical power connections. Interdigitated vertical power connections are shown in FIGS. 15A and 15B of the MCM Disclosure and described as preferably being spatially arranged to allow routing of signals laterally between the vertical power connections. However, to minimize the parasitic impedance of the vertical power connections to the semiconductor device, the number of connections should be large, the polarities should be alternating between adjacent connections, i.e., interdigitated, the spacing between adjacent connections should be small, and the length of the connections should be minimized. Thus, the ideal cell size or pitch in a multi-cell converter for powering large semiconductor loads may be advantageously minimized. Using the SAC topology, a multi-cell fixed-ratio converter as shown in FIGS. 2 and 3 operating at approximately 2 MHz may have a cell pitch of approximately 3.5 mm. As shown in FIG. 3, the polarities of the output terminations of the multi-cell converter alternate within each column, e.g. proceeding from top to bottom within each column, the output terminations are common (313), positive (312), common (313). While the interdigitation at the scale of the converter cell pitch is beneficial, it may not provide a sufficiently low impedance for the extremely large and fast load steps produced by many modern processors, GPUs, and ASICs.

Figure 4:
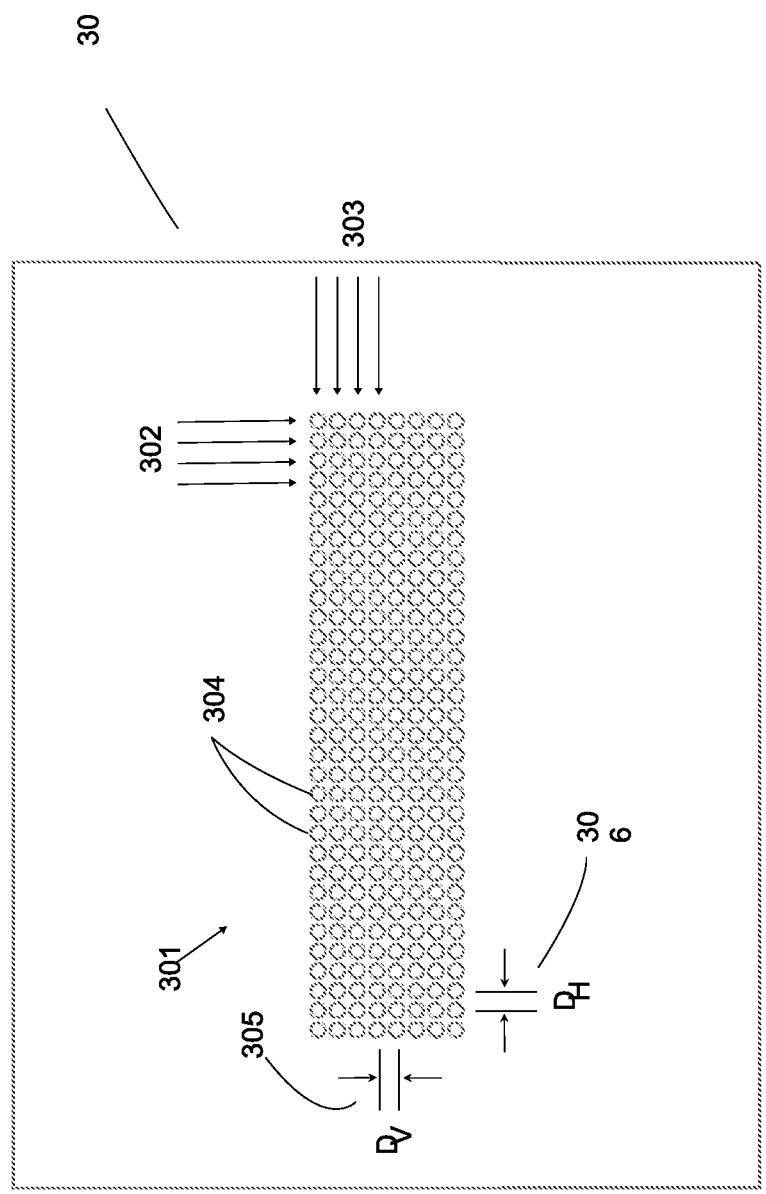
FIG. 4 shows an example of a power reticle for a semiconductor device such as a GPU.

Referring to FIG. 4, a generalized example of a semiconductor die, semiconductor package, or intervening substrate, 30 is shown having a preferred array of contacts 304 through which power may be delivered vertically to circuitry on the die, package, or substrate 30. The array of contacts may be referred to as a vertical semiconductor power grid 301. FIG. 4 is representative of vertical power connections to a semiconductor device, which may be in the form of a wafer, a single die, a semiconductor package including one or more dice, or a substrate to which a wafer, one or more semiconductor die and/or semiconductor packages is/are mounted and reference to the die 30 should be understood to refer to any such configuration. As shown, a large multiplicity of closely-spaced and interdigitated grid contacts 304 are provided in an array of eight rows, e.g. rows 303, and thirty two columns, e.g. columns 302, to both satisfy the current requirements of, and reduce the parasitic impedance of, vertical power connections to, the semiconductor die 30. The vertical connections in the grid 301 are large in number, closely-spaced, e.g. on a 1 mm or less pitch, and interdigitated, i.e. the polarity of each individual power connection 304 is preferably opposite to the polarity of its adjacent power connections to provide a very low interconnection impedance. The contacts in the grid 301 as shown include a vertical (in plan view) spacing, e.g. Dv 305, between rows 303 and a horizontal (in plan view) spacing, e.g. DH 306, between adjacent columns 302. Although shown as a simple grid of contacts in uniform rows and columns, it will be appreciated that the contacts may be distributed in any manner necessary or desired for distributing power to the semiconductor device. To illustrate the difference between the power grid 301 of the semiconductor and the natural contact structure of the multi-cell power converter, the power grid in FIG. 4 is shown having the same footprint as the multi-cell converter package of FIG. 3. The actual size of the semiconductor die, package, or intervening substrate, 30, the area in which the power grid is located, and the density of the contacts within the grid 301 may be a function of the semiconductor, package, or intervening substrate design. The configuration, size, and number of multi-cell converters 310 used to power the die 30 may be a function of the die current or power requirements, heat density, and available cooling. Generally, the size and spacing, e.g. Dv 305 and DH 306 (preferably 1 mm or less), of the contacts, e.g. 304, in the power grid 301 should be much smaller than the spacing available for the power terminations 312, 313 of the multi-cell converter 310, e.g. 3.5 mm in the example described above.

FIGS. 5A and 5B respectively show exploded isometric top and bottom views of a converter assembly 390, which, as shown, includes the multi-cell converter 310 mated with an interconnection module 350. FIG. 5A shows the converter terminations 311, 312, 313, on surface 320 of the multi-cell converter 310 (discussed above in connection with FIG. 3). The interconnection module 350 may be used to establish the low impedance vertical connections to the semiconductor die 30 using the interdigitated contacts 304 in the power grid 301 to which the semiconductor die, package, or intervening substrate, 30, may preferably be adapted to mate, provide energy storage to the die 30 via the low impedance vertical connections, and translation to the power terminations of the multi-cell converter 310, which are fewer in number, larger, and spaced further apart than the interdigitated contacts 304 in the power grid. Thus the interconnection module 350 may provide electrical and mechanical translation between the converter output terminals arranged in a first pattern and the power input terminals of the semiconductor device arranged in a second pattern, while enabling very low impedance vertical connections. The interconnection module may further provide a mechanical platform allowing the die, package, or intervening substrate, 30 and the converter 310 to be assembled together providing signal connectivity and mechanical integrity.

The interconnection module 350 as shown may include a PCB 353 and an optional layer of cured encapsulant 354. Electrically-conductive pads, e.g. pads 361, 362, and 363, may be formed on the surface 351 (FIG. 5B) of the cured encapsulant in locations configured as shown to align and mate with corresponding terminations 311, 312, 313 on surface 320 (FIG. 5A) of the multi-cell module 310. On the surface 352 of the interconnection module 350, which may as shown be a surface of the PCB 353, conductive pads 364 (FIG. 5A) may be formed in a pattern configured to mate and align with corresponding contacts 304 in the power grid 301 (FIG. 4) of semiconductor die 30. It is important to note that the conductive pads are formed on a surface of the PCB 353 in a pattern that mates with similar contacts provided on the semiconductor die, wafer, package, or intervening substrate, 30 to provide the shortest possible connections between the two. Although the pads 364 are shown as a land grid area, solder balls, e.g. in a ball grid array, or other contact structures (e.g., conductive pins) may be used. Preferably, the contacts 364 are arranged to alternate between positive and common polarities (interdigitated) to reduce the parasitic inductance of the interconnections. Although shown as individual pads, a copper plane, e.g. connected to the negative or common terminals may be provided on PCB surface 353 with solder mask defining each individual pad and with isolation around the pads connected to the positive terminals.

Figure 6:
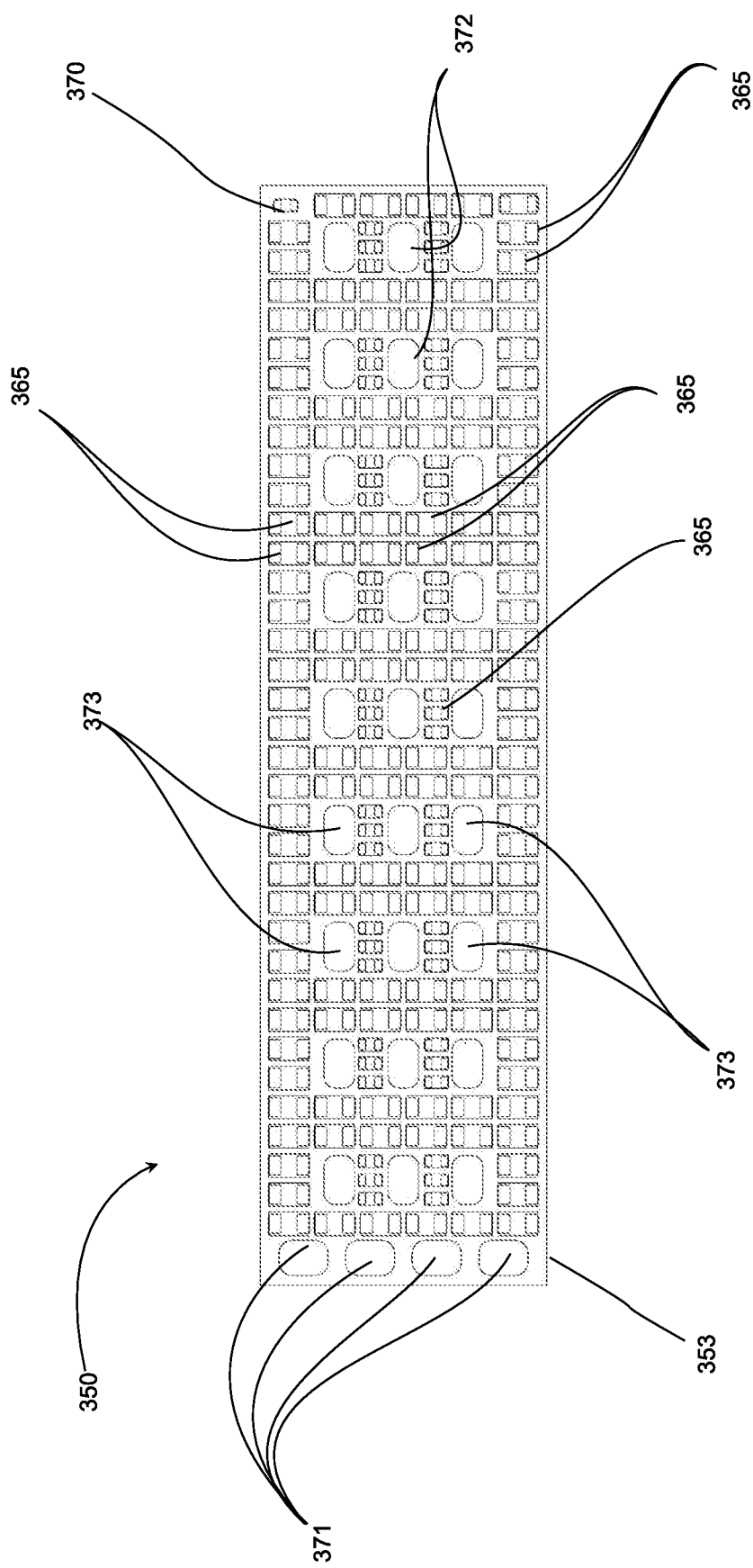
FIG. 6 is a plan view of the un-encapsulated interconnection module.

Internally, the PCB 353 may include a plurality of conductive layers separated by intervening dielectric layers. For example, the PCB 353 may include a conductive layer for each power plane (positive and common), a surface conductive layer for components and a second surface conductive layer on the opposite surface for contact pads 364. It may be advantageous to include one or more additional conductive layers for each of the power planes, e.g. to reduce interconnection resistance, in alternating layers to increase the capacitance between the power planes and reduce parasitic inductances. Referring to FIG. 6, a plan view of the component side of the PCB 353 is shown having conductive pads 371, 372, and 373 which form the foundation for the pads 361, 362, and 363 on the finished interconnection module; a multiplicity of capacitors 365 arranged between and among the pads 371, 372, and 373; and a temperature sensor 370. The capacitors 365, which provide energy storage for the die, can be part of filter circuitry electrically connected to the pads, e.g. pads 372 and 373 (FIG. 6) and pads 362 and 363 (FIG. 5B). The capacitors may be preferably mounted as shown on the opposite surface of the interconnection module PCB to avoid extending the vertical distance between the interconnection PCB and the semiconductor die 30. The components and pads as shown in FIG. 6 may be covered by encapsulant to form the surface 351 of the interconnection module. The electrical contacts 361, 362, and 363 may be formed on the surface 351 of the interconnection module 350 (cured encapsulant 354) by forming holes in the encapsulant 354 at the desired locations exposing the respective conductive pads 371, 372, and 373 on the PCB surface; forming one or more metal layers on the surface 351 including in the holes to contact the conductive pads 371, 372, and 373 at the bottom of the holes; patterning the metal layers as desired, e.g. into strips 366, 367, and 368 (FIG. 5B) which may match the strips 316, 317, 318 on the converter 310 as shown; and optionally filling the metalized holes; as described in the Leadless and Trench disclosures. As shown in FIG. 5B, the strips 366, 367, and 368 are electrically isolated from one another. Preferably, the pads 371, 372, and 373 are formed on the external surface 351 of the PCB 353 and connected to the respective internal power planes using conductive vias to avoid the need for large clearance holes in the power planes.

Some semiconductor devices may tend to concentrate current draw in specific regions of the die, e.g. in the centrally located contacts in the power grid. The interconnection module or multi-cell converter or both may be configured to force a desired current distribution on the semiconductor die, e.g. by providing a series resistance that is slightly lower in areas in which current flow is to be encouraged and slightly higher in areas where the current flow is to be reduced. In the interconnection module, for example, connections between the power planes and selected contact pads 364 may be configured to provide a series resistance that is slightly lesser, than the nominal average series resistance of the contacts 364, e.g. using additional vias near the selected contacts, or conversely provide a slightly greater resistance, using fewer vias or other PCB features, for contacts through which lower current flow is desired. By tailoring the series resistance of the pads 364 in selected areas of the grid compared to other areas, the interconnection module may compensate for the inequalities in current distribution on the die. It may however be preferable to modulate the equivalent output resistance of individual output cells directly to achieve a similar effect more efficiently and dynamically. Methods of controlling the output resistance of the converter are described in Vinciarelli, Output Resistance Modulation in Power Converters, U.S. Pat. No. 6,934,166 issued Aug. 23, 2005, assigned to VLT, Inc. of Andover, Mass., and incorporated in its entirety here by reference (the "Modulation" patent); in Vinciarelli, Adaptive Control of Resonant Power Converters, U.S. Pat. No. 10,020,752 issued Jul. 10, 2018, assigned to VLT, Inc. of Andover, Mass., and incorporated in its entirety here by reference (the "ASAC" patent); and in Vinciarelli, Digital Control of Resonant Power Converters, U.S. Pat. No. 9,166,481 issued Oct. 20, 2015, assigned to VLT, Inc. of Andover, Mass., and incorporated in its entirety here by reference (the "Digital Controller" patent). For example, gate drive signals to the rectifier switches, SR1, SR2 (FIG. 2) of each output cell (250: FIG. 2) or group of cells may be modulated to affect output resistance changes in each cell. For example, separate gate drive inputs may be provided for each cell or group of cells, or circuitry that attenuates the gate drive signal for specific output cells or groups of output cells may be provided. Alternatively, gate drive circuitry may be provided in the same package with the multi-cell converter. The gate drive modulation approach is preferable for the ability to dynamically reconfigure the output resistance of the cells or groups of cells during operation, e.g. in response to signals from the die. Alternatively, the circuitry may provide one-time gate drive programmability as a configuration option for more static compensation.

Figure 7:
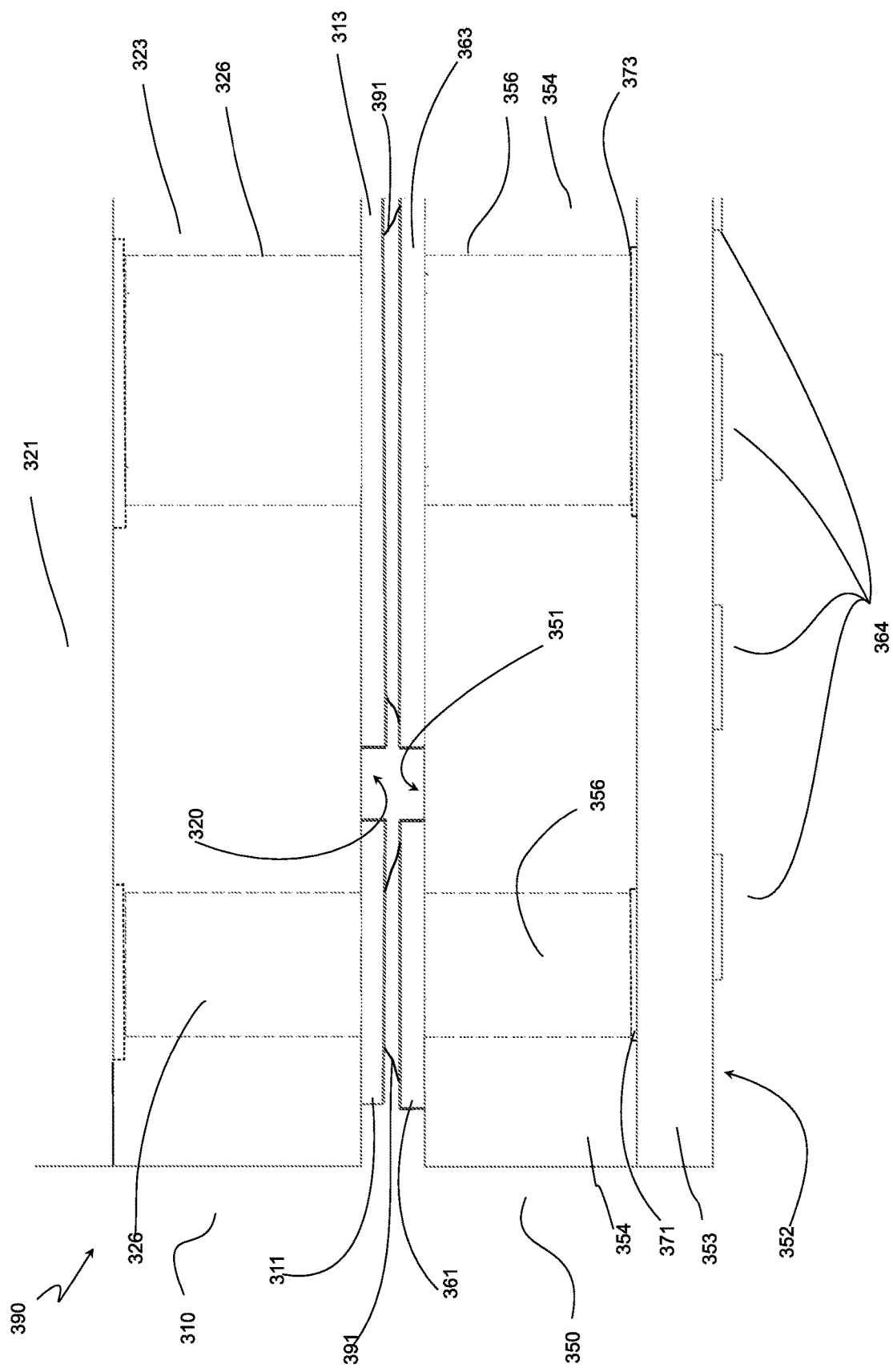
FIG. 7 shows a cross section of a portion of the converter assembly.
Figure 9:
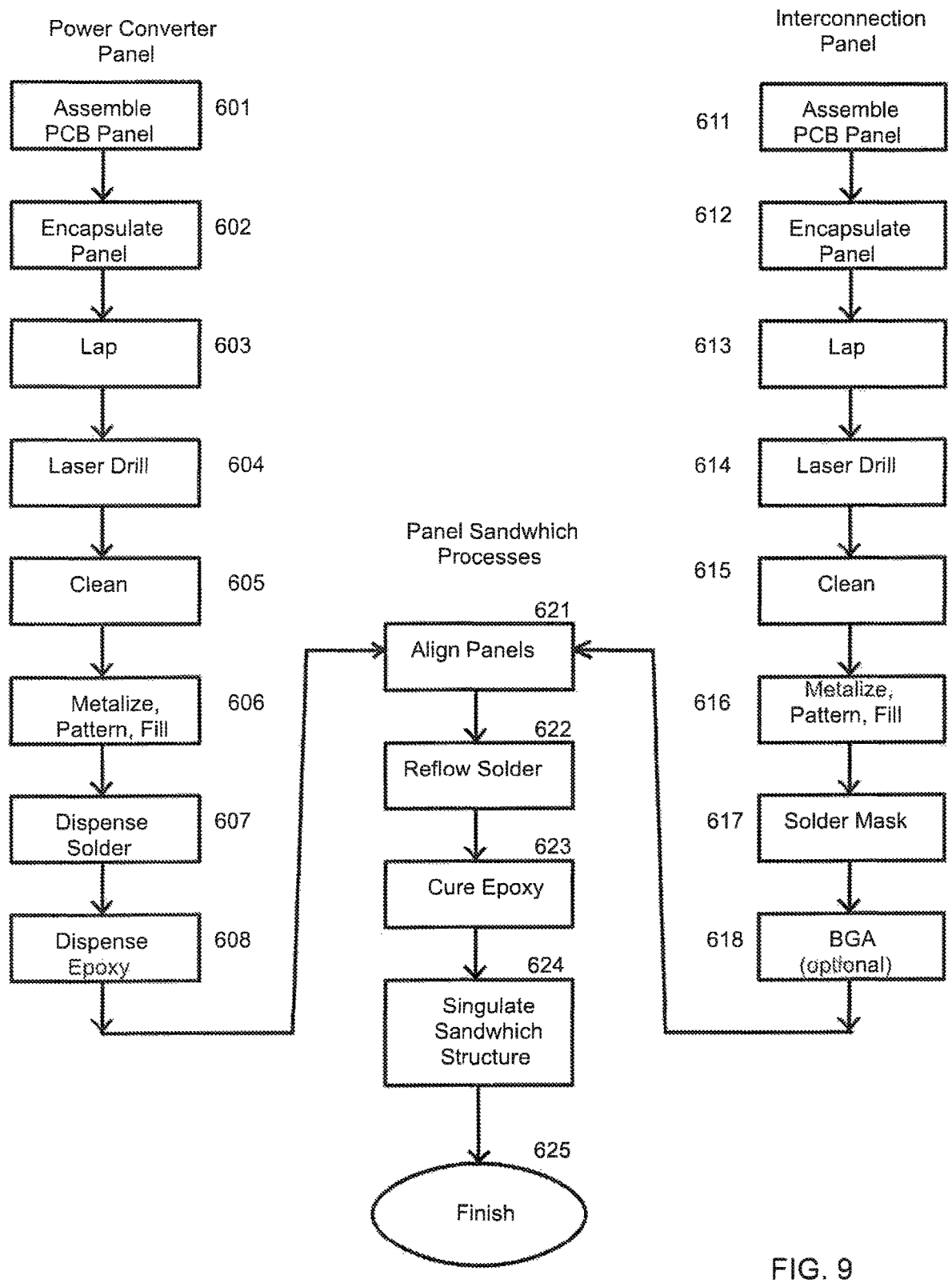
FIG. 9 is a process flow for fabricating the converter assemblies.

A preferred method of manufacturing the converter assembly 390 will be described in connection with FIGS. 7, 8A, 8B, and 9. FIG. 7 shows a cross section of a portion of the converter assembly 390 revealing solder connections 391 between converter terminations 311 and 313 and interconnection pads 361 and 363, respectively. Holes 326 formed in the encapsulant 323 of the multi-cell converter 310 to form the contact terminations 311 and 313 are shown in broken lines extending from the surface 320 to the surface of PCB 321. Similarly, holes 356 formed in the encapsulant 354 of the interconnection module 350 to form the contact terminations 361 and 363 are shown in broken lines extending from the surface 351 to the surface of the PCB 353. As shown in FIGS. 8A and 8B, a panel 340 comprising a plurality of the multi-cell converters 310 may be assembled with a panel 380 comprising a plurality of the interconnection modules 350 to form a panel-sandwich structure 400 comprising a plurality of the converter assemblies 390 prior to singulation. A side view of the panel-sandwich structure 400 is shown in FIG. 8B having solder balls attached (optional process step 618: FIG. 9) to contacts 364 as an alternative to the land grid array shown in FIGS. 5A and 7. An adhesive, e.g. epoxy (not shown), may be dispensed between the solder connections 391 and preferably along the boundary lines between each individual module prior to forming the solder connections 391 between the two panels 340 and 380, e.g., on the surface of at least one of the panels 340 and 380 along the cut lines between the modules. The cured epoxy may provide mechanical strength and serve as a seal between the panels during singulation.

A preferred manufacturing process flow will be described with reference to FIG. 9 which shows two parallel paths for fabrication of the power converter panel 340 and the interconnection panel 380 prior to step 621. The power converter panels may be prepared as described in the Panel Mold, Leadless, and Trench disclosures as shown in steps 601 through 608 of FIG. 9. For example, the PCB panel may be assembled (601) and encapsulated (602) then lapped (603), holes drilled (604), e.g. holes 326 (FIG. 7), cleaned (605) and then metalized (606) to form the contacts, e.g. contacts 311, 312, 313 (FIGS. 3, 5A, and 7). The metalization step 606 may include patterning the metal layer(s) on the surfaces, e.g. to form the conductive strips 316, 317, and 318 (FIG. 3) described above. Solder may then be dispensed onto the contacts, e.g. 311, 312, 313 (FIG. 5A) and epoxy dispensed in preselected locations between the contacts and preferably along the perimeter of each individual module, e.g. along the cut lines.

The interconnection panels may be prepared in a similar manner as shown in steps 611 through 618 of FIG. 9. For example, the PCB panel may be assembled (611) and encapsulated (612), preferably on one side, and then lapped (613), holes drilled (604), e.g. holes 356 (FIG. 7), cleaned (615) and then metalized (616) to form the contacts, e.g. contacts 361, 362, 363 (FIGS. 5B and 7) with pads, e.g. pads 371 and 373 on the surface of the PCB 353. The metalization step (616) may include patterning the metal layer(s) on the surface 351, e.g. to form the above-described conductive strips 366, 367, and 368 (FIG. 5B).

The converter panels 340 and interconnection panels 380 may then be assembled together as shown in steps 621-625. The panels 340 and 380 may be aligned (621) with each other, e.g. using a fixture to maintain coplanarity of the panels during subsequent solder reflow (622) and epoxy cure (623). Afterward, the panel sandwich may be cut along predetermined cut lines to singulate the converter assemblies 390. Preferably, the cuts are made in a manner that leaves an epoxy connection between the converter module 310 and the interconnection module 350 along the entire periphery of the assembly 390 providing a seal during singulation and subsequent manufacturing steps.

Although the above example of the multi-cell converter is based upon a fixed-ratio sine amplitude converter topology, other converter topologies may be used. For example, the converter assembly 390 may be implemented using a multiphase buck converter or switched capacitor converter, e.g. with each phase defining an individual output cell, together with the interconnection module 350 providing interconnection translation and optional filtering. Fixed ratio, regulating, or quasi-regulating topologies may be used.

Figure 10A:
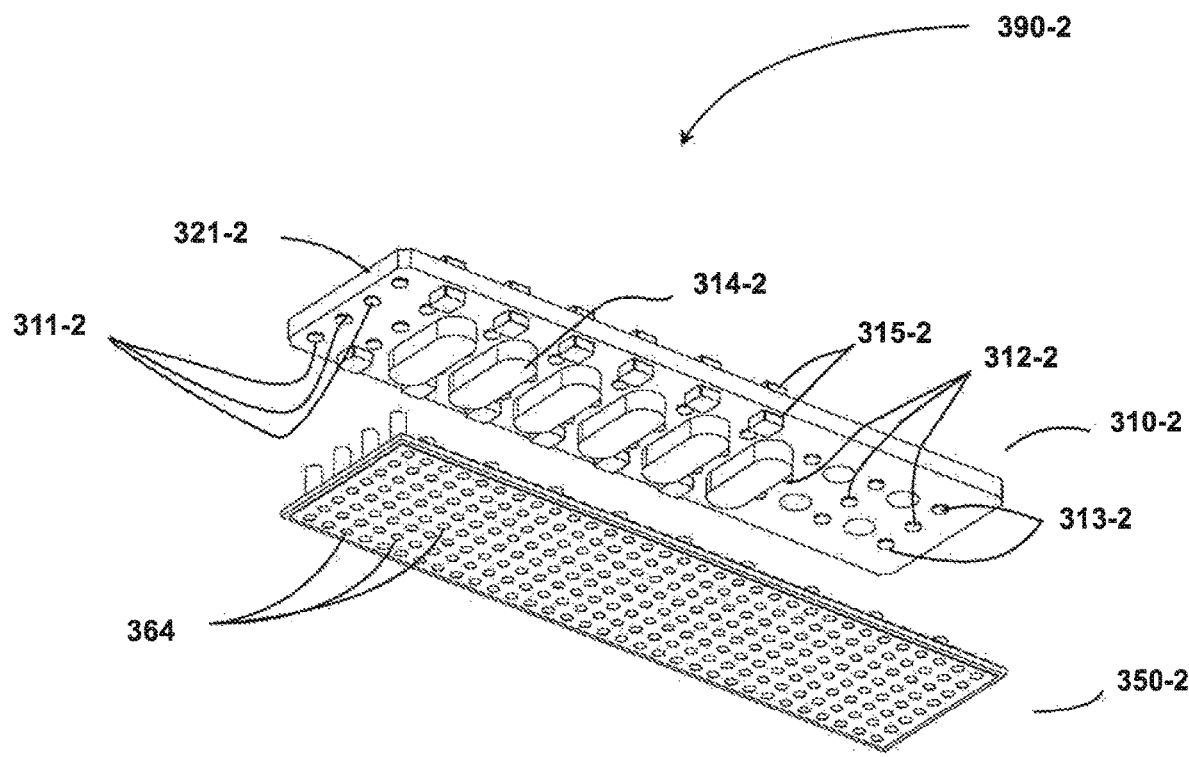
FIGS. 10A and 10B show top and bottom isometric views of an exploded converter assembly including an open-frame multi-cell converter module and an open-frame interconnection module.
Figure 10B:
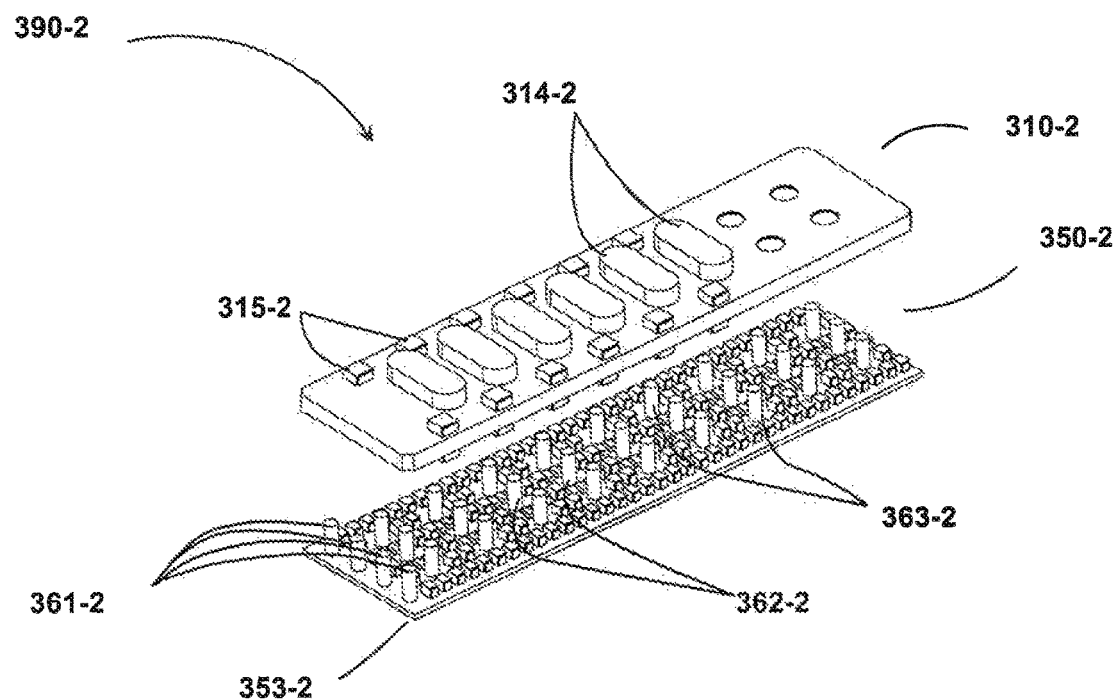

Similarly, although the above examples are based upon encapsulated multi-cell converter and interconnection modules, it will be appreciated that either or both may be open-frame assemblies. Referring to FIGS. 10A and 10B, open frame examples of a multi-cell converter module 310-2 and interconnection module 350-2 are shown forming a converter assembly 390-2. As shown, vertical connections between the converter PCB 321-2 and the interconnection module PCB 353-2 may be made using conductive pillars or pins, e.g. electrically conductive pillars 361-2, 362-2, and 363-2 extending from interconnection module PCB 353-2 to mating pads, e.g. conductive pads 311-2, 312-2, and 313-2 on the surface of the multi-cell converter PCB 321-2.

Although the pillars and pads are shown respectively as part of the interconnection module 350-2 and multi-cell converter module 310-2, it will be understood that they may be reversed. The pillars 361-2, 362-2, and 363-2 may provide vertical spacing and mechanical support between the two modules. The conductive pads 364 may be arranged on the surface of PCB 353-2 as described above in connection with FIG. 5A in a pattern configured to mate and align with corresponding contacts 304 in the power grid 301 (FIG. 4) of the semiconductor die, wafer, package, or intervening substrate 30 as described above. The capacitors should be mounted as shown on the surface of the interconnection module PCB opposite the conductive pads 364 to avoid extending the vertical distance between the interconnection PCB and the semiconductor die 30.

The converter assembly 390 is shown comprising separate multi-cell converter 310 and interconnection module 350 assemblies which accommodates the three-dimensional nature of the SAC topology shown (components and cores mounted to both sides of the converter PCB 321). However, with other converter topologies that may be amenable to more planar designs, e.g. analogous to a system in a package that occupies only one side of the PCB, the converter and interconnection module may use the same PCB, i.e. occupy a single PCB, or may have their respective PCBs in contact or assembled together, e.g. laminated, to form a composite PCB structure, optionally with internal spaces for the energy storage capacitors.

Figure 11:
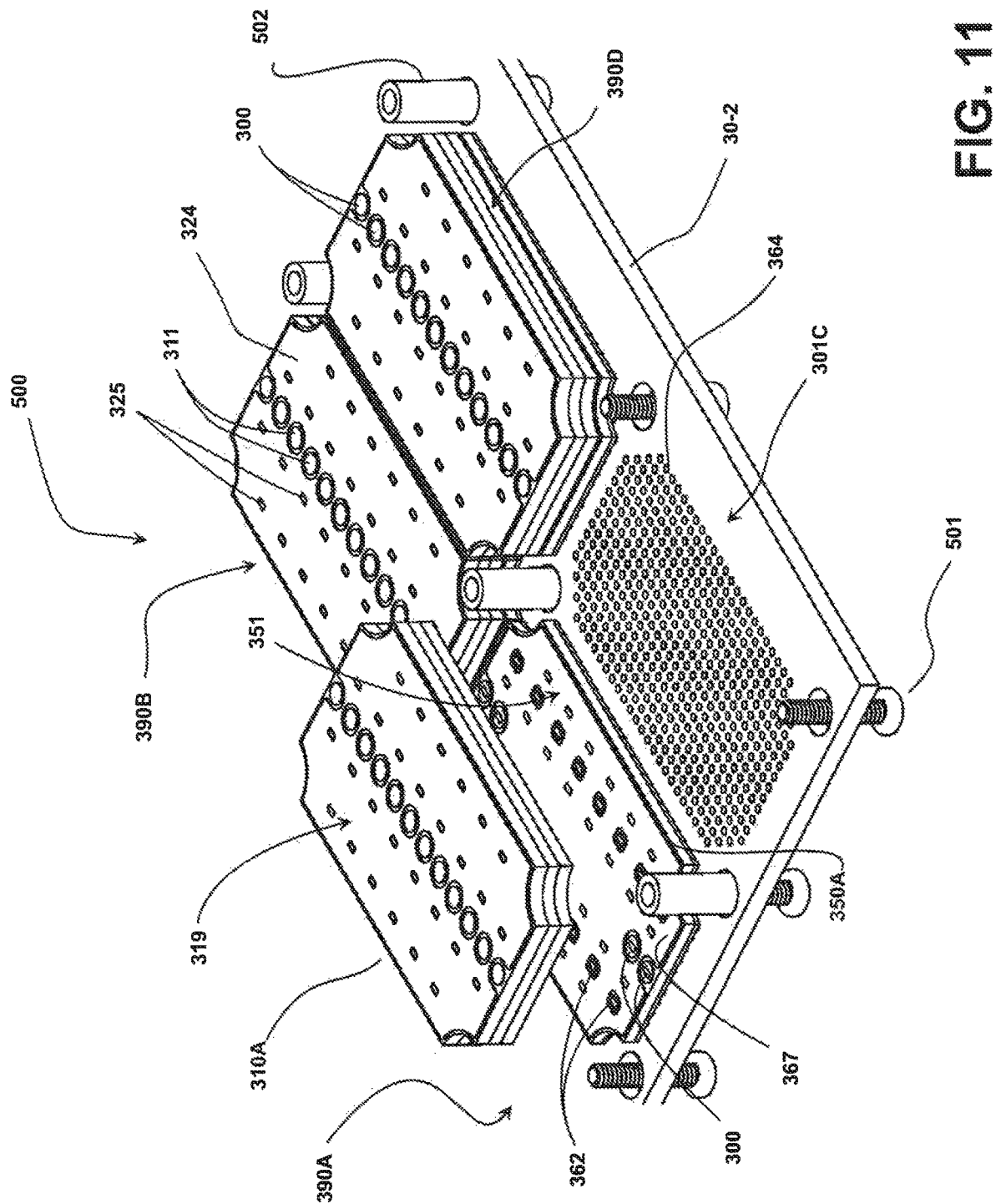
FIG. 11 shows a vertical power delivery system.

Referring to FIG. 11, a system 500 is shown comprising a plurality of multi-cell converter assemblies, e.g. 390A, 390B, and 390D, each comprising a multi-cell converter, e.g. 310A, and an interconnection module, e.g. 350A, mounted to a portion of a very large scale semiconductor package 30-2, which may carry a plurality of semiconductor dice or a semiconductor wafer. Mounting hardware including screws, e.g. screw 501, and standoffs or pressure cylinders, e.g. 502, as shown may be included to provide mechanically robust connections in the assembly. Although the package 30-2 is shown schematically having a plurality of contacts 364 arranged in a plurality of power grids, e.g. grid 301C, it will be appreciated that the size, number, and configurations of the grids and the converter assemblies may be adapted to a large variety of configurations. In the example 500 of FIG. 11, a single almost continuous conductive shield is provided on the surfaces of the interconnection module 350A and multi-cell converter 310A. Additionally, input power and control signals may be applied to input terminals 311 on the top surface of the converter assemblies 390 as shown in FIG. 11. Some signals may pass through the converter assembly 390 from the top to the semiconductor package, e.g. using dedicated terminals 300 as shown. Using the manufacturing processes described above and in the panel mold disclosures, the converter assembly package may be arranged as shown to provide clearance for mounting hardware while still maximizing utilization of the available area for active circuitry, e.g. conversion cells and energy storage.

A number of embodiments of the invention have been described. Nevertheless, it will be understood that various modifications may be made without departing from the spirit and scope of the invention. For example, the converter assembly 390 may be implemented using other converter topologies for the multi-cell converter 310, e.g. multiphase buck converter topologies or switched capacitor converter topologies may be used, e.g. with each phase defining an individual output cell. Fixed ratio, regulating, or quasi-regulating topologies may be used. The multi-cell converter described above is an example in which the driver and switch control circuitry are packaged separately, however the control and drive electronics also may be incorporated into the multi-cell converter. The interconnection module 350 may be fabricated using other methods to provide interconnection translation and optional filtering. Although a single assembly 390 is shown for powering the ASIC 30, it will be appreciated a plurality of modules may be used. Similarly, a single interconnection module may be used to mount a plurality of converter modules 310 to the ASIC 30 or substrate to which the ASIC is mounted. The assembly 390 may be mounted directly to a wafer, a die, a substrate on which the substrate or die is mounted, or a package on or in which the wafer or die is mounted. Although the preferred method for manufacturing the converter assembly forms the panel sandwich prior to singulation, the interconnection module may be fabricated and singulated prior to attachment to one or more converter modules.

In this document, the term "x-input terminal" may be used to refer to the input terminal of the interconnection module 350, so as to differentiate from the input terminal of the converter 310 and the input terminal of the ASIC 30. The 'x' in the "x-input terminal" does not represent a number. Two input terminals of the interconnection module 350 may be referred to as two x-input terminals. Similarly, the term "x-output terminal" may be used to refer to the output terminal of the interconnection module 350, so as to differentiate from the output terminal of the converter 310 and the output terminal of the ASIC 30. The 'x' in the "x-output terminal" does not represent a number. Two output terminals of the interconnection module 350 may be referred to as two x-output terminals.

Accordingly, other embodiments are within the scope of the following claims.

What is claimed is:

1. A method of powering a semiconductor device having power input terminals, the method comprising:
    providing a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals;
    providing an interconnection module having x-input terminals arranged on a first side of the interconnection module in a pattern configured to align with the first pattern of converter output terminals, and x-output terminals arranged on a surface of a second opposite side of the interconnection module in a second pattern configured to align with the power input terminals of the semiconductor device, the second pattern having a second spacing between x-output terminals, the second spacing being different than the first spacing, the x-input terminals being electrically connected to the x-output terminals;
    assembling the power conversion module to the first side of the interconnection module with each converter output terminal mated with and electrically connected to a respective x-input terminal;
    wherein the interconnection module is configured to provide electrical and mechanical translation between the converter output terminals arranged in the first pattern and the power input terminals of the semiconductor device arranged in the second pattern;
    wherein the power conversion module and the interconnection module are stacked to form a module sandwich including the power conversion module in a first layer, electrical connections between the converter output terminals and the x-input terminals in a second layer, and the interconnection module in a third layer.

2. A method of powering a semiconductor device, including at least one semiconductor die having a plurality of die power input terminals arranged on a surface of the die and having edges of the semiconductor die defining a die footprint, the semiconductor device having power input terminals arranged within the footprint of the die, the method comprising:
    providing a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals;
    providing an interconnection module having x-input terminals arranged on a first side of the interconnection module in a pattern configured to align with the first pattern of converter output terminals, and x-output terminals arranged on a surface of a second opposite side of the interconnection module in a second pattern arranged within the die footprint and configured to align with the power input terminals of the semiconductor device, the second pattern having a second spacing between x-output terminals, the second spacing being different than the first spacing, the x-input terminals being electrically connected to the x-output terminals;
    assembling the power conversion module to the first side of the interconnection module with each converter output terminal mated with and electrically connected to a respective x-input terminal;
    wherein the interconnection module is configured to provide electrical and mechanical translation between the converter output terminals arranged in the first pattern and the power input terminals of the semiconductor device arranged in the second pattern;
    wherein the power conversion module and the interconnection module are stacked to form a module sandwich including the power conversion module in a first layer, electrical connections between the converter output terminals and the x-input terminals in a second layer, and the interconnection module in a third layer.

3. The method of claim 1 or 2 wherein the interconnection module further comprises filter circuitry connected to the x-input terminals and the x-output terminals.

4. The method of claim 3 wherein the interconnection module further comprises a multilayer printed circuit board ("PCB"), and the filter circuitry comprises a plurality of capacitors mounted to a first surface of the PCB on the first side of the interconnection module.

5. The method of claim 3 wherein the second spacing is less than the first spacing.

6. The method of claim 3 wherein each conversion cell further comprises a first dimension and the first spacing is configured as a function of the first dimension.

7. The method of claim 6 wherein each conversion cell further comprises a second dimension, the first spacing further comprises a latitudinal spacing and a longitudinal spacing, and the latitudinal spacing is a function of the first dimension and the longitudinal spacing is a function of the second dimension.

8. The method of claim 1 or 2, further comprising configuring the conversion circuitry as a buck converter having a plurality of phases with each conversion cell configured to operate as a selected one of the phases.

9. The method of claim 1 or 2, further comprising configuring the conversion circuitry to convert power received from an input to the power conversion module at an input voltage, VIN, and input current, TIN, for delivery to the converter output terminals at an output voltage, VOUT, and an output current, IOUT, using a transformation ratio, K, where K=VOUT/VIN, that is essentially constant, subject to an equivalent output resistance.

10. The method of claim 9, further comprising encapsulating the conversion circuitry to form a first surface of the power conversion module; encapsulating the interconnection module to form a first surface on the first side of the interconnection module; affixing the first surface of the power conversion module to the first surface of the interconnection module with the converter output terminals and the x-input terminals aligned using an adhesive, and forming solder connections between respective one of the output terminals and the x-input terminals.

11. The method of claim 1 or 2 wherein the interconnection module further comprises a multilayer printed circuit board ("PCB") and the method further comprises mounting at least one solder ball to the PCB for each x-output terminal.

12. The method of claim 1 or 2 wherein the interconnection module further comprises a multilayer printed circuit board ("PCB") and the method further comprises mounting at least one conductive pin to the PCB for each x-output terminal.

13. The method of claim 1 or 2 wherein the interconnection module further comprises a multilayer printed circuit board ("PCB") and the method further comprises providing the x-output terminals in a land grid array on the PCB.

14. The method of claim 1 or 2, further comprising attaching the semiconductor device to the interconnection module with the x-output terminals aligned with and electrically connected to respective ones of the power input terminals; and wherein the connections between the x-output terminals and the power input terminals form a fourth layer in the module sandwich.

15. The method of claim 1 or 2, further comprising
assembling a first panel comprising a plurality of unsingulated power conversion modules;
assembling a second panel comprising a plurality of unsingulated interconnection modules;
wherein the assembling of the power conversion module and the interconnection module is performed using the first and second panels prior to singulation to form a panel sandwich and further comprises dispensing epoxy between the first and second panels and forming solder connections between each converter output terminal and each respective x-input terminal; and
further comprising:
cutting the panel sandwich along predetermined cut lines to singulate a plurality of the module sandwiches.

16. The method of claim 15 wherein the dispensing epoxy further comprises dispensing epoxy on the surface of at least one of the panels along the cut lines.

17. The method of claim 16, further comprising reflowing solder and curing the epoxy.

18. The method of claim 1 further comprising arranging the x-output terminals with alternating polarities.

19. The method of claim 1 further comprising arranging the x-output terminals with polarities that alternate between adjacent columns.

20. The method of claim 1 further comprising arranging the x-output terminals with polarities that alternate between adjacent rows.

21. The method of claim 1 further comprising arranging the x-output terminals with polarities that alternate between adjacent x-output terminals.

22. The method of claim 1 further comprising arranging the converter output terminals with alternating polarities.

23. The method of claim 1 further comprising arranging the converter output terminals with polarities that alternate between rows.

24. The method of claim 1 further comprising arranging the converter output terminals with polarities that alternate between columns.

25. The method of claim 1 further comprising arranging the converter output terminals with polarities that alternate between adjacent converter output terminals.

26. The method of claim 21, further comprising assembling the sandwich structure to a substrate with the x-output terminals aligned with and electrically connected to respective terminals on a surface of the substrate, the substrate including a semiconductor device electrically connected to receive power from the power conversion module; and
further comprising conducting heat vertically from the converter module through the sandwich structure including through the interconnection module and substrate.

27. A method of making power converters, the method comprising:
assembling an encapsulated panel including a printed circuit board ("PCB") having electronic components mounted to the PCB and a plurality of conductive features enclosed within the panel and unexposed to an exterior surface of the panel, the panel comprising one or more power conversion modules having boundaries defined by one or more predetermined cut lines;
configuring each of the one or more power conversion modules in a multi-cell structure having a plurality of conversion cells, each conversion cell including one or more converter output nodes arranged in a first pattern having a first spacing between the output nodes, and wherein each output node is electrically connected to a respective conductive feature;
selectively forming a plurality of holes in the exterior surface of the panel, each hole being formed at a respective predetermined location aligned with a respective output node, spaced apart from the cut lines, and exposing within the hole the respective conductive feature;
selectively forming one or more conductive metal layers on the exterior surface of the panel including within the plurality of holes, the one or more conductive metal layers within each hole being in electrical contact with the respective conductive feature, to form a plurality of electrical contacts on the exterior surface of the panel;
patterning the one or more conductive metal layers on the exterior surface to electrically isolate at least one electrical contact from one or more of the plurality of electrical contacts;

cutting the panel along the one or more cut lines to singulate the one or more power conversion modules, each singulated power conversion module having a respective plurality of the electrical contacts formed on the exterior surface of the module.

28. The method of claim 27 further comprising selectively filling the plurality of holes with solder.

29. The method of claim 28, further comprising planarizing the solder to a predetermined height relative to the exterior surface.

30. The method of claim 27 wherein each conversion cell further comprises a first dimension and a second dimension, the first spacing further comprises a latitudinal spacing and a longitudinal spacing, and the latitudinal spacing is a function of the first dimension and the longitudinal spacing is a function of the second dimension.

31. The method of claim 27, further comprising:
providing an interconnection module having x-input terminals arranged on a first surface of the interconnection module in a pattern configured to align with the first pattern of converter output terminals, and x-output terminals arranged on a second surface in a second pattern, the second pattern having a second spacing between the x-output terminals, the second spacing being different than the first spacing, the x-input terminals being electrically connected to the x-output terminals;
assembling the first surface of the interconnection module to the power conversion module with each converter output terminal mated with and electrically connected to a respective x-input terminal,
wherein the power conversion module and the interconnection module are stacked to form a sandwich structure including the power conversion module in a first layer, electrical connections between the converter output terminals and the x-input terminals in a second layer, and the interconnection module in a third layer.

32. The method of claim 31, further comprising assembling the sandwich structure to a substrate with the x-output terminals aligned with and electrically connected to respective terminals on a surface of the substrate.

33. The method of claim 32 wherein the substrate includes a semiconductor device electrically connected to receive power from the power conversion module.

34. A method of making electronic assemblies, the method comprising:
providing an electronic module having electronic circuitry including circuit terminals arranged in a first pattern having a first spacing between the circuit terminals;
providing an interconnection module having x-input terminals arranged on a first surface of the interconnection module in a pattern configured to align with the first pattern of circuit terminals, and x-output terminals arranged on a second surface in a second pattern configured to align with external terminals of a third electronic device, the second pattern having a second spacing between the x-output terminals, the second spacing being different than the first spacing, the x-input terminals being electrically connected to the x-output terminals;
assembling the electronic module to the first surface of the interconnection module with each circuit terminal mated with and electrically connected to a respective x-input terminal;
wherein the interconnection module is configured to provide electrical and mechanical translation between the circuit terminals arranged in the first pattern and the external terminals of the third electronic device arranged in the second pattern;
wherein the electronic module and the interconnection module are stacked to form a module sandwich including the electronic module in a first layer, electrical connections between the circuit terminals and the x-input terminals in a second layer, and the interconnection module in a third layer;
assembling a first panel comprising a plurality of unsingulated electronic modules;
assembling a second panel comprising a plurality of unsingulated interconnection modules;
wherein the assembling of the electronic module and the interconnection module is performed using the first and second panels prior to singulation to form a panel sandwich and further comprises dispensing a curable adhesive compound between the first and second panels and forming solder connections between each circuit terminal and each respective x-input terminal; and
cutting the panel sandwich along predetermined cut lines to singulate a plurality of the module sandwiches.

35. The method of claim 34 wherein the dispensing the curable adhesive compound further comprises dispensing the curable adhesive compound on the surface of at least one of the panels along the cut lines.

36. The method of claim 34, further comprising reflowing solder and curing the adhesive compound.

37. A method of forming modular circuit assemblies, the method comprising:
assembling first and second encapsulated panels each including a first multilayer printed circuit board ("PCB") having a plurality of conductive layers, a first plurality of electronic components mounted to a first surface of the PCB, and a first layer of cured encapsulant covering the first plurality of electronic components and the surface of the PCB, the first layer of cured encapsulant forming a first exterior surface of the encapsulated panel, the encapsulated panel comprising a plurality of unsingulated electronic modules, each electronic module having perimeter boundaries defined by one or more predetermined cut lines;
selectively forming a plurality of terminal holes in the first exterior surface of each panel through the first layer at predetermined locations within the perimeter boundaries of each electronic module, each terminal hole being spaced apart from the cut lines and exposing within the terminal hole a respective conductive feature;
selectively forming one or more conductive metal layers on the first exterior surface of each panel including within the plurality of terminal holes, the one or more conductive metal layers within each terminal hole being in electrical contact with the respective conductive feature;
patterning the one or more conductive metal layers on the exterior surface, to form a plurality of electrical contacts on the exterior surface of each panel electrically isolated from at least one other electrical contact in the plurality of electrical contacts;
assembling the first and second encapsulated panels with electrical contacts on the first panel aligned and mated with respective electrical contacts on the second panel to form a panel stack, the panel stack comprising a plurality of un-singulated module stacks, each module stack including an unsingulated electronic module in the first panel and a respective unsingulated electronic module in the second panel; and cutting the panel stack along the one or more cut lines to singulate the plurality of electronic module stacks.

38. The method of claim 37, further comprising dispensing a curable adhesive compound on the surface of at least one of the panels along the cut lines.

39. The method of claim 38, further comprising reflowing solder and curing the adhesive compound.

40. An apparatus comprising:
a semiconductor device having power input terminals;
a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals; and
an interconnection module having x-input terminals arranged on a first surface of the interconnection module in a pattern configured to align with the first pattern of converter output terminals, and x-output terminals arranged on a second surface in a second pattern configured to align with the power input terminals of the semiconductor device, the second pattern having a second spacing between x-output terminals, the second spacing being different than the first spacing, the x-input terminals being electrically connected to the x-output terminals;
the converter output terminals of the power conversion module being mated with and electrically connected to respective x-input terminals of the interconnection module;
wherein the interconnection module is configured to provide electrical and mechanical translation between the converter output terminals arranged in the first pattern and the power input terminals of the semiconductor device arranged in the second pattern;
wherein the power conversion module and the interconnection module are stacked with the power conversion module located at a first level, electrical connections between the converter output terminals and the x-input terminals at a second level, and the interconnection module at a third level.

41. The apparatus of claim 40 wherein the semiconductor device comprises a die.

42. The apparatus of claim 40 wherein the semiconductor device comprises a wafer.

43. The apparatus of claim 40 wherein the semiconductor device comprises a substrate.

44. The apparatus of claim 40 wherein the semiconductor device comprises a semiconductor die or package mounted to a substrate.

45. A method of powering a semiconductor device having power input terminals, the method comprising:
providing a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals;
providing an interconnection module having x-input terminals arranged on a first surface of the interconnection module in a pattern configured to align with the first pattern of converter output terminals, and x-output terminals arranged on a second surface in a second pattern configured to align with the power input terminals of the semiconductor device, the second pattern having a second spacing between x-output terminals, the second spacing being different than the first spacing, the x-input terminals being electrically connected to the x-output terminals;
providing a plurality of conductive pillars for electrically connecting the converter output terminals with respective x-input terminals;
assembling the power conversion module to the interconnection module with each converter output terminal aligned with and electrically connected to a respective x-input terminal by a respective one of the conductive pillars;
wherein the interconnection module is configured to provide electrical and mechanical translation between the converter output terminals arranged in the first pattern and the power input terminals of the semiconductor device arranged in the second pattern;
wherein the power conversion module and the interconnection module are stacked to form a module sandwich including the power conversion module in a first layer, the conductive pillars connecting the converter output terminals and the x-input terminals in a second layer, and the interconnection module in a third layer; and
wherein the x-output terminals are arranged with alternating polarities to reduce interconnection inductance.

46. The method of claim 44 further comprising arranging the x-output terminals with alternating polarities.

47. The method of claim 45 further comprising arranging the converter output terminals with alternating polarities.

48. The method of claim 45, further comprising assembling the sandwich structure to a substrate with the x-output terminals aligned with and electrically connected to respective terminals on a surface of the substrate, the substrate including a semiconductor device electrically connected to receive power from the power conversion module; and
further comprising conducting heat vertically from the converter module through the sandwich structure and out the top of the substrate.

49. An apparatus comprising:
a semiconductor device, including at least one semiconductor die having a plurality of die power input terminals arranged on a surface of the die and having edges of the semiconductor die defining a die footprint, the semiconductor device having power input terminals arranged within the footprint of the die;
a power conversion module having switching power conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals; and
an interconnection module having x-input terminals arranged on a first surface of the interconnection module in a pattern configured to align with the first pattern of converter output terminals, and x-output terminals arranged on a second surface in a second pattern with alternating polarities configured to align with the power input terminals of the semiconductor device, the second pattern having a second spacing between x-output terminals, the second spacing being different than the first spacing, the x-input terminals being electrically connected to the x-output terminals;

the converter output terminals of the power conversion module being mated with and electrically connected to respective x-input terminals of the interconnection module;

wherein the interconnection module is configured to provide electrical and mechanical translation between the converter output terminals arranged in the first pattern and the power input terminals of the semiconductor device arranged in the second pattern;

wherein the power conversion module and the interconnection module are stacked with the power conversion module located at a first level, electrical connections between the converter output terminals and the x-input terminals at a second level, and the interconnection module at a third level.

50. The apparatus of claim 49 wherein the semiconductor device comprises a wafer.

51. The apparatus of claim 50 wherein the wafer comprises a multiplicity of un-singulated dice on the wafer.

52. The apparatus of claim 49 wherein the semiconductor device further comprises a substrate, and the semiconductor die is mounted to the substrate within the die footprint.

53. An apparatus for delivering power vertically to a semiconductor die, the die having a plurality of semiconductor power input terminals arranged on a surface of the semiconductor die and having edges of the semiconductor die defining a die footprint, the apparatus comprising:

switching power conversion circuitry arranged on a first substrate having a plurality of switching power conversion cells and a plurality of converter output terminals, the switching power conversion circuitry being configured to convert power received at a first voltage for delivery via the converter output terminals at a second lower voltage;

translation interconnections including X-input terminals configured and arranged to align with and electrically connect to the converter output terminals, a plurality of X-output terminals configured and arranged with alternating polarities to align with respective power input terminals of the semiconductor die, and a plurality of vertical conductors to make electrical connections to the X-output terminals;

a capacitive array arranged between the power conversion circuitry and the semiconductor die and electrically connected to the translation interconnections to provide energy storage;

wherein the translation interconnections are configured to provide electrical and mechanical translation between the converter output terminals and the power input terminals of the semiconductor die;

wherein the switching power conversion circuitry, the translation interconnections, and the capacitive array, are each configured and arranged within a respective footprint configured to occupy substantially all of the die footprint, and are together configured and arranged to form a vertical stack configured to occupy substantially all of the die footprint.

54. The apparatus of claim 53 wherein the power conversion circuitry further comprises converter input terminals arranged on a first surface of the first substrate.

55. The apparatus of claim 53, further comprising the semiconductor die and wherein the semiconductor die is mounted to the stack with the power input terminals of the semiconductor die aligned with and electrically connected to the X-output terminals.

56. The apparatus of claim 55 wherein the power flows vertically through the stack essentially within the die footprint.

57. The apparatus of claim 55 wherein the capacitive array comprises a plurality of discrete capacitors arranged to occupy spaces between the X-input terminals.

58. The apparatus of claim 55 wherein the X-output terminals use a spacing between terminals of 1mm or less.

59. The apparatus of claim 53 wherein the capacitive array comprises a plurality of discrete capacitors arranged to occupy spaces between the X-input terminals.

60. The apparatus of claim 59 wherein the capacitors are arranged on a second substrate.

61. The apparatus of claim 60 wherein the power conversion circuitry comprises a fixed-ratio conversion topology.

62. The apparatus of claim 60 wherein the power conversion circuitry comprises a multi-phase buck conversion topology.

63. The apparatus of claim 60 wherein the power conversion circuitry comprises a switched capacitor conversion topology.

64. The apparatus of claim 53 wherein the power conversion circuitry further comprises converter input terminals arranged along an edge of a surface of the first substrate.

65. The apparatus of claim 53 further comprising one or more conductive terminals passing through the vertical stack configured to carry signals through the vertical stack.

66. The apparatus of claim 60 further comprising one or more conductive terminals passing through the vertical stack configured to carry signals through the vertical stack.

67. A vertical power delivery apparatus for a semiconductor die, the semiconductor die having a plurality of semiconductor power input terminals arranged on a surface of the semiconductor die and having edges of the semiconductor die defining a die footprint;

the vertical power delivery apparatus comprising in a vertical stack configured to occupy, in whole or in part, the die footprint, the vertical stack comprising:

(a) point-of-load ("POL") switching power conversion circuitry (i) arranged on a substrate within a conversion footprint, (ii) including a plurality of switching power conversion cells connected in parallel to convert power from an input at an input voltage for delivery to the semiconductor power input terminals at a die voltage, (iii) the input voltage being at least five times higher than the die voltage, and (iv) the conversion footprint being configured to occupy, in whole or in part, the die footprint;

(b) interdigitated output terminals (i) electrically connected to receive power from the switching power conversion cells, (ii) configured within a terminal footprint to match the plurality of semiconductor power input terminals, (iii) the terminal footprint being configured to occupy, in whole or in part, the die footprint; and (c) a capacitive array (i) arranged between the power conversion circuitry and the semiconductor die, (ii) within a filter footprint configured to occupy, in whole or in part, the die footprint and (iii) electrically connected to the interdigitated output terminals.

68. A vertical power delivery apparatus for a semiconductor die, the semiconductor die having a plurality of semiconductor power input terminals arranged on a surface of the semiconductor die and having edges of the semiconductor die defining a die footprint;

the vertical power delivery apparatus comprising in a vertical stack configured to occupy, in whole or in part, the die footprint, the vertical stack comprising:
(a) point-of-load ("POL") switching power conversion circuitry (i) arranged on a substrate within a conversion footprint, (ii) including a plurality of switching power conversion cells connected in parallel to convert power from an input at an input voltage to the semiconductor power input terminals at a die voltage, (iii) the input voltage being at least five times higher than the die voltage, (iv) the conversion footprint being configured to occupy, in whole or in part, the die footprint;
(b) interdigitated output terminals (i) electrically connected to receive power from the switching power conversion cells, (ii) configured within a terminal footprint to match the plurality of semiconductor power input terminals, (iii) the terminal footprint being configured to occupy, in whole or in part, the die footprint;
(c) a capacitive array (i) arranged between the power conversion circuitry and the semiconductor die, (ii) within a filter footprint configured to occupy, in whole or in part, the die footprint, and (iii) electrically connected to the interdigitated output terminals; and
(d) a plurality of vertical conductors arranged within the die footprint to connect the interdigitated output terminals to the switching power conversion cells.

69. The vertical power delivery apparatus of claim 68 wherein the POL switching power conversion circuitry further comprises a plurality of power conversion output terminals including a space between adjacent ones of the power conversion output terminals and wherein the interdigitated output terminals are electrically connected to the plurality of the power conversion output terminals by the vertical conductors.

70. The vertical power delivery apparatus of claim 69 wherein multiple ones of the plurality of vertical conductors are electrically connected together by lateral electrical connections within the die footprint.

71. The vertical power delivery apparatus of claim 70 wherein the power conversion output terminals are connected to the vertical conductors by the lateral electrical connections.

72. The vertical power delivery apparatus of claim 67 or 68 wherein the interdigitated output terminals further comprise a space of one millimeter or less between adjacent ones of the interdigitated output terminals.

73. The vertical power delivery apparatus of claim 67 or 68 wherein the POL switching power conversion circuitry further comprises a plurality of power conversion output terminals including a space between adjacent ones of the power conversion output terminals and wherein the capacitive array comprises a plurality of discrete capacitors arranged in the spaces between the power conversion output terminals.

74. The apparatus of claim 67 or 68 wherein the switching power conversion circuitry comprises a plurality of power switches, an inductance, a fixed-ratio conversion topology, and is configured to use a current flowing in the inductance to charge and discharge capacitances in the switching power conversion circuitry and reduce a voltage across the one or more power switches prior to turn ON or turn OFF of the one or more of the power switches.

75. The apparatus of claim 74 wherein the switching power conversion circuitry comprises a switched capacitor conversion topology.

76. The apparatus of claim 74 wherein the switching power conversion circuitry further comprises a transformer, and wherein power is converted via the transformer from an input at an input voltage to the semiconductor power input terminals.

77. The apparatus of claim 74 wherein the power conversion circuitry comprises a multi-phase buck conversion topology.

78. The apparatus of claim 75 wherein the power conversion circuitry comprises a multi-phase buck conversion topology.

79. The apparatus of claim 75 wherein the interdigitated output terminals, the plurality of semiconductor power input terminals, and the vertical power connections are configured to provide the shortest electrical path between the semiconductor die and the switching power conversion circuitry.

80. The apparatus of claim 67 or 68 wherein the switching power conversion circuitry comprises a plurality of power switches and an inductance and is configured to use a current flowing in the inductance to charge and discharge capacitances in the switching power conversion circuitry and reduce a current through one or more one of the power switches prior to turn ON or turn OFF of the one or more of the power switches.

81. The apparatus of claim 67 or 68 further comprising first stage switching power conversion circuitry for converting power from a first stage input at a first stage input voltage for delivery to the input of the POL switching power conversion circuitry; wherein the first stage switching power conversion circuitry and the POL switching power conversion circuitry comprise a fixed-ratio conversion topology and a regulating topology.

82. The apparatus of claim 81 wherein the first stage switching power conversion circuitry comprises a regulating topology.

83. The apparatus of claim 81 wherein the POL switching power conversion circuitry comprises a regulating topology.

84. The apparatus of claim 68 wherein the vertical conductors are arranged to align with the interdigitated output terminals.

85. The apparatus of claim 84 wherein the interdigitated output terminals and the vertical conductors occupy the entire die footprint.

86. The apparatus of claim 85 wherein the interdigitated output terminals and the vertical conductors extend beyond the die footprint in at least one lateral direction.

87. The apparatus of claim 85 wherein the interdigitated output terminals and the vertical conductors extends beyond the die footprint in at least two lateral directions.

88. The apparatus of claim 67 or 68 wherein at least a portion of the stack is encapsulated.

89. The apparatus of claim 88 wherein the POL switching power conversion circuitry is encapsulated.

90. The apparatus of claim 84 wherein the matrix of vertical conductors are formed in a second substrate and the interdigitated output terminals are formed on a surface of the second substrate.

91. The apparatus of claim 67 or 68 wherein the stack is provided as a self-contained module adapted to be installed as a unit.

92. The apparatus of claim 67 or 68 wherein the capacitive array comprises a multiplicity of discrete capacitors.

93. The apparatus of claim 67 or 68 wherein the input of the POL switching power conversion circuitry further comprises terminals on a surface of the substrate.

94. The apparatus of claim 67 wherein the matrix of interdigitated output terminals further comprise conductors electrically connecting the interdigitated output terminals to the switching power conversion circuitry, the conductors being substantially arranged to occupy the die footprint.

95. The apparatus of claim 67 wherein the conductors are arranged in a matrix with alternating polarities to align with the interdigitated output terminals.

96. The apparatus of claim 95 wherein the matrix of interdigitated output terminals and the matrix of conductors occupy the entire die footprint.

97. The apparatus of claim 96 wherein the matrix of interdigitated output terminals and the matrix of conductors extend beyond the die footprint in at least one lateral direction.

98. The apparatus of claim 96 wherein the matrix of interdigitated output terminals and the matrix of conductors extend beyond the die footprint in at least two lateral directions.

99. The apparatus of claim 95 wherein the matrix of conductors are formed in a second substrate and the interdigitated output terminals are formed on a surface of the second substrate.

100. The apparatus of claim 32, 49, 50, or 51, further comprising a capacitive array vertically arranged between the power conversion module and the semiconductor device, within a filter footprint configured to occupy, in whole or in part, the die footprint, and electrically connected to the X-output terminals.

101. The apparatus of claim 100 wherein the capacitive array comprises a plurality of discrete capacitors arranged between the x-input terminals.

102. The apparatus of claim 100 wherein the interconnection module further comprises a second substrate, the x-output terminals are formed on a surface of the second substrate, and further comprising a matrix of vertical conductors formed in the second substrate within the die footprint.

103. The apparatus of claim 102 wherein the power conversion module and the interconnection module are provided stacked together as a self-contained module adapted to be installed as a unit.

104. The apparatus of claim 101 further comprising first stage switching power conversion circuitry for converting power from a first stage input at a first stage input voltage for delivery to the input of the power conversion module; wherein the first stage switching power conversion circuitry and the power conversion module comprise a fixed-ratio conversion topology and a regulating topology.

105. The apparatus of claim 104 wherein the first stage switching power conversion circuitry comprises a regulating topology.

106. The apparatus of claim 104 wherein the power conversion module comprises a regulating topology.

107. The apparatus of claim 30, 32, 33, 49, 50, or 51 wherein the second spacing between x-output terminals is one millimeter or less.

108. The apparatus of claim 30, 32, 33, 49, 50, or 51 wherein the power conversion circuitry comprises a plurality of power switches, an inductance, a fixed-ratio conversion topology, and is configured to use a current flowing in the inductance to charge and discharge capacitances in the switching power conversion circuitry and reduce a voltage across the one or more power switches prior to turn ON or turn OFF of the one or more of the power switches.

109. The apparatus of claim 108 wherein the switching power conversion circuitry comprises a switched capacitor conversion topology.

110. The apparatus of claim 108 wherein the switching power conversion circuitry further comprises a transformer, and wherein power is converted power from an input at an input voltage to the semiconductor power input terminals.

111. The apparatus of claim 30, 32, 33, 49, 50, or 51 wherein the switching power conversion circuitry comprises a multi-phase buck conversion topology.

112. The apparatus of claim 32, 49, 50, or 51 wherein the x-output terminals are electrically connected to the x-input terminals by vertical power conductors arranged with the die footprint.

113. The apparatus of claim 30, 32, 33, 49, 50, or 51 wherein the switching power conversion circuitry comprises a plurality of power switches and an inductance and is configured to use a current flowing in the inductance to charge and discharge capacitances in the switching power conversion circuitry and reduce a current through one or more one of the power switches prior to turn ON or turn OFF of the one or more of the power switches.

\* \* \* \* \*

UNITED STATES PATENT AND TRADEMARK OFFICE
CERTIFICATE OF CORRECTION

| | | |
|---|---|---|
| PATENT NO. | : 10,903,734 B1 | Page 1 of 1 |
| APPLICATION NO. | : 16/218418 | |
| DATED | : January 26, 2021 | |
| INVENTOR(S) | : Patrizio Vinciarelli | |

It is certified that error appears in the above-identified patent and that said Letters Patent is hereby corrected as shown below:

On the Title Page

Page 3, Column 1, Item (56) Other Publications, Line 35, delete "lntersil" and insert -- Intersil --.

In the Drawings

Sheet 11 of 13, FIG. 9, middle of figure, delete "Panel Sandwhich Processes" and insert -- Panel Sandwich Processes --.

Sheet 11 of 13, FIG. 9, block 624, delete "Singulate Sandwhich Structure" and insert -- Singulate Sandwich Structure --.

In the Specification

Column 2, Line 47, delete "TIN" and insert -- IIN --.

Column 9, Line 23, delete "terminals" and insert -- Terminals --.

In the Claims

Column 19, Line 14, in Claim 9, delete "TIN" and insert -- IIN --.

Column 24, Line 33, in Claim 46, delete "claim 44" and insert -- claim 45 --.

Signed and Sealed this
First Day of June, 2021

Drew Hirshfeld
*Performing the Functions and Duties of the
Under Secretary of Commerce for Intellectual Property and
Director of the United States Patent and Trademark Office*